(12) United States Patent
Ueda

(10) Patent No.: US 9,064,590 B2
(45) Date of Patent: *Jun. 23, 2015

(54) DRIVING METHOD OF SEMICONDUCTOR STORAGE DEVICE AND SEMICONDUCTOR STORAGE DEVICE

(71) Applicant: Kabushiki Kaisha Toshiba, Minato-ku, Tokyo (JP)

(72) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

This patent is subject to a terminal disclaimer.

(21) Appl. No.: 13/780,791

(22) Filed: Feb. 28, 2013

(65) Prior Publication Data

US 2013/0229861 A1 Sep. 5, 2013

Related U.S. Application Data

(63) Continuation-in-part of application No. 13/601,492, filed on Aug. 31, 2012.

(30) Foreign Application Priority Data

Mar. 2, 2012 (JP) ................................. 2012-047016
Mar. 21, 2012 (JP) ................................. 2012-064458

(51) Int. Cl.
*G11C 11/00* (2006.01)
*G11C 11/14* (2006.01)
(Continued)

(52) U.S. Cl.
CPC ............ *G11C 11/1673* (2013.01); *G11C 7/065* (2013.01); *G11C 7/1063* (2013.01); *G11C 7/1096* (2013.01)

(58) Field of Classification Search
USPC ......................... 365/148, 158, 163, 171, 173
See application file for complete search history.

(56) References Cited

U.S. PATENT DOCUMENTS 5,361,227 A 11/1994 Tanaka et al.
5,546,351 A 8/1996 Tanaka et al.
(Continued)

FOREIGN PATENT DOCUMENTS

JP  H61994-76586   3/1994
JP  2001-184857 A  7/2001
(Continued)

OTHER PUBLICATIONS

Song et al.; "A 31ns Random Cycle VCAT-Based $4F^2$ DRAM With Manufacturability and Enhanced Cell Efficiency." IEEE Journal of Solid-State Circuits, Vol. No. 4, Apr. 2010. pp. 880-888.
(Continued)

*Primary Examiner* — Trong Phan
(74) *Attorney, Agent, or Firm* — Knobbe, Martens, Olson & Bear, LLP

(57) ABSTRACT

In a memory, a signal holder holds voltages according to data in the storage elements. A busy-signal controller controls a busy-signal. The busy-signal determines whether to permit or reject reception of a read/write enable signal. During reception of the read/write enable signal is rejected, the signal holder holds a first to a third voltages. The first voltage corresponds to target data stored in a first storage element. The second voltage corresponds to first sample data of first logic written to the first storage element. The third voltage corresponds to second sample data of second logic. A sense amplifier detects logic of the target data by comparing a read signal of the first voltage with a reference signal generated by the second and third voltages. The write driver writes the target data/write data to the first storage element. After writing, the reception of the read/write enable signal is permitted.

20 Claims, 24 Drawing Sheets

(51) Int. Cl.
*G11C 11/15* (2006.01)
*G11C 11/16* (2006.01)
G11C 7/06 (2006.01)
G11C 7/10 (2006.01)

(56) References Cited

U.S. PATENT DOCUMENTS

| | | | |
|---|---|---|---|
| 5,615,165 | A | 3/1997 | Tanaka et al. |
| 5,724,300 | A | 3/1998 | Tanaka et al. |
| 5,793,696 | A | 8/1998 | Tanaka et al. |
| 5,818,791 | A | 10/1998 | Tanaka et al. |
| 5,909,399 | A | 6/1999 | Tanaka et al. |
| 6,172,911 | B1 | 1/2001 | Tanaka et al. |
| 6,188,615 | B1 | 2/2001 | Perner et al. |
| 6,317,376 | B1 | 11/2001 | Tran et al. |
| 6,597,601 | B2 | 7/2003 | Ooishi |
| 6,649,953 | B2 | 11/2003 | Cha |
| 6,760,266 | B2 | 7/2004 | Garni et al. |
| 6,781,895 | B1 | 8/2004 | Tanaka et al. |
| 6,788,571 | B2 | 9/2004 | Ooishi et al. |
| 6,804,144 | B2 | 10/2004 | Iwata |
| 6,842,366 | B2 | 1/2005 | Tanizaki et al. |
| 6,967,892 | B2 | 11/2005 | Tanaka et al. |
| 7,139,201 | B2 | 11/2006 | Tanaka et al. |
| 7,920,405 | B2 * | 4/2011 | Kang et al. ............ 365/148 |
| 8,493,776 | B1 * | 7/2013 | Yu et al. ............... 365/158 |
| 8,542,525 | B2 * | 9/2013 | Berger et al. ......... 365/158 |
| 8,687,412 | B2 * | 4/2014 | Chih et al. ............ 365/158 |
| 2009/0323402 | A1 | 12/2009 | Li et al. |

FOREIGN PATENT DOCUMENTS

| | | |
|---|---|---|
| JP | 2002-032983 A | 1/2002 |
| JP | 2003-151262 | 5/2003 |
| JP | 2003-151262 A | 5/2003 |
| JP | 2003-178573 | 6/2003 |
| JP | 2003-346473 A | 12/2003 |
| JP | 2004-103104 | 4/2004 |

OTHER PUBLICATIONS

G. Jeong et al. "A 0.24-μm 2.0-V 1T1MTJ 16-kb Nonvolatile Magnetoresistance RAM With Self-Reference Sensing Scheme" IEEE Journal of solid-state circuits, vol. 38, No. 11, Nov. 2003, pp. 1906-1910.

Japanese Office Action for Patent Application 2012-064458, to which the present case claims priority, dated Apr. 25, 2014, 6 pages including translation.

* cited by examiner

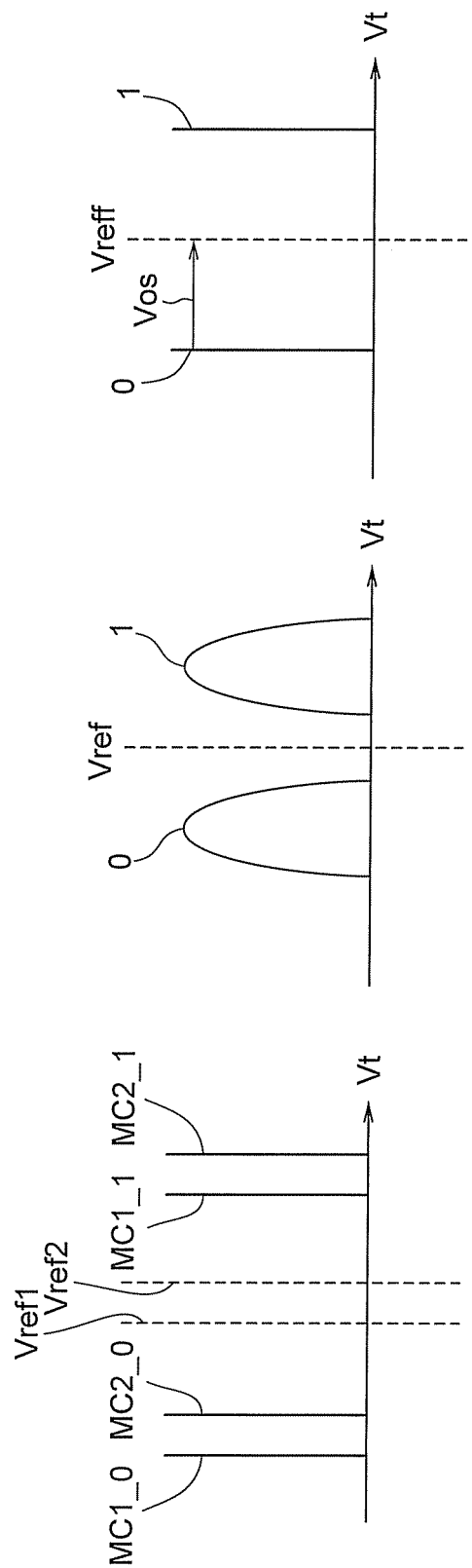

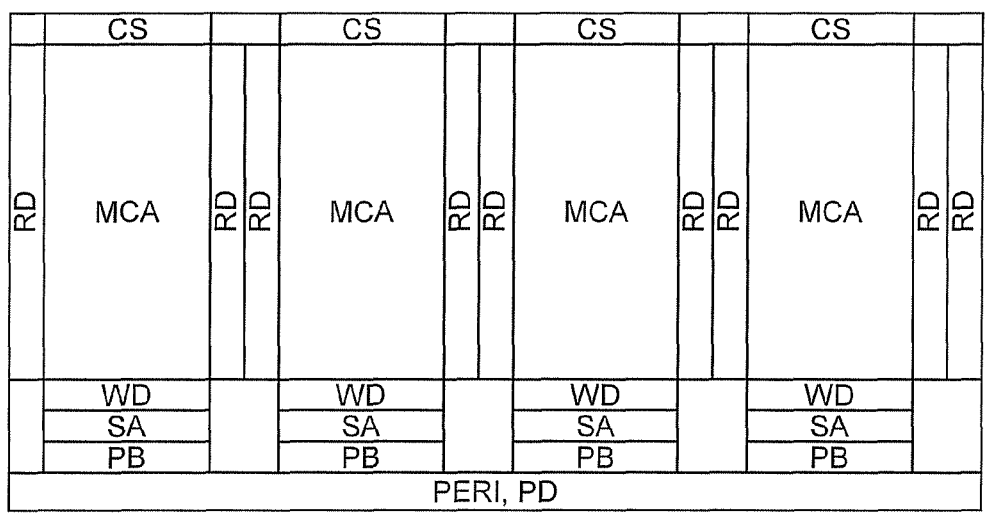
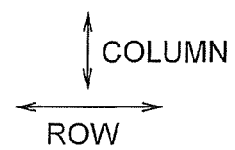
FIG.22

DRIVING METHOD OF SEMICONDUCTOR STORAGE DEVICE AND SEMICONDUCTOR STORAGE DEVICE

CROSS REFERENCE TO RELATED APPLICATIONS

This application is based upon and claims the benefit of priority from the prior Japanese Patent Application No. 2012-64458, filed on Mar. 21, 2012, the prior U.S. patent application Ser. No. 13/601,492, filed on Aug. 31, 2012, and the prior Japanese Patent Application No. 2012-47016, filed on Mar. 2, 2012, the entire contents of which are incorporated herein by reference.

FIELD

The embodiments of the present invention relate to manufacturing method of semiconductor storage device and semiconductor storage device.

BACKGROUND

There is known a magnetic random access memory (MRAM) as one type of resistive random access memories. A resistance change ratio of the MRAM using STT (Spin Transfer Torque)-type MTJ elements becomes lower when the MRAM is downscaled. In this case, since a read signal difference becomes smaller, it is necessary for the MRAM to detect data with high accuracy when reading the data. In order to read the data with high accuracy, reference data is preferably closer to the intermediate between data "1" and data "0". However, in the downscaled MRAM, it is disadvantageously difficult to set the reference data to be closer to the intermediate between the data "1" and the data "0".

BRIEF DESCRIPTION OF THE DRAWINGS

FIGS. 7A to 7C are graphs for explaining respective reference signals generated in the MRAM according to the present embodiment and MRAMs according to comparative examples;

FIG. 22 is a layout view of the memory chip 1 according to a fifth embodiment;

DETAILED DESCRIPTION

A semiconductor storage device according to an embodiment includes a plurality of resistance change storage elements. A signal holder holds a plurality of voltages according to data stored in the storage elements. A sense amplifier detects the data stored in the storage elements based on the voltages held in the signal holder. A write driver writes data to the storage elements. A busy signal controller controls a busy signal. The busy signal determines whether to permit or reject reception of a read enable signal or whether to permit or reject reception of a write enable signal. The read enable signal enables data to be read from the storage elements. The write enable signal enables data to be written to the storage elements. In a period during which the busy signal controller controls the busy signal to reject the reception of the read enable signal or the write enable signal, the signal holder holds a first voltage, a second voltage and a third voltage. The first voltage corresponds to target data stored in a first storage element selected from among the storage elements. The second voltage corresponds to first sample data of first logic written to the first storage element. The third voltage corresponds to second sample data of second logic opposite to the first logic and written to the first storage element. The sense amplifier detects logic of the target data stored in the first storage element by comparing a read signal based on the first voltage with a reference signal generated based on the second and third voltages. The write driver writes the target data or write data to the first storage element. After the write driver writes the write data, the busy signal controller controls the busy signal to permit the reception of the read enable signal or the write enable signal.

Embodiments will now be explained with reference to the accompanying drawings. The present invention is not limited to the embodiments.

Figure 1:
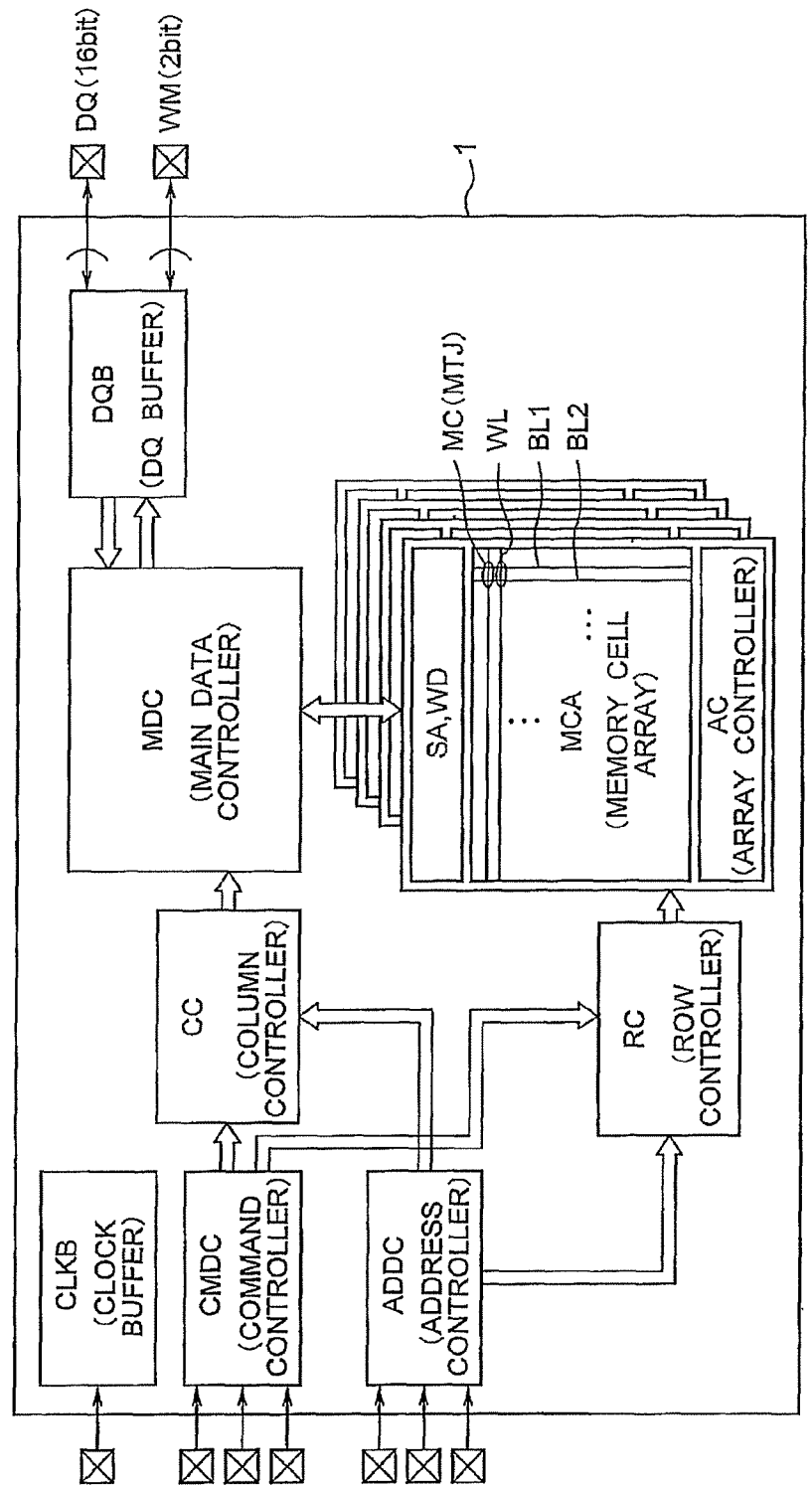
FIG. 1 is a block diagram showing a memory chip of a magnetic random access memory according to an embodiment.

FIG. 1 is a block diagram showing a memory chip of a magnetic random access memory (hereinafter, "MRAM") according to a present embodiment. The present embodiment is not limited to the MRAM but applicable to a memory (such as a PCRAM or an ReRAM) using resistance change elements other than the MRAM.

The MRAM according to the present embodiment includes memory cell arrays MCA, sense amplifiers SA, a main data controller MDC, a DQ buffer DQB, a column controller CC, a row controller RC, a clock buffer CLKB, a command controller CMDC, an address controller ADDC, and array controllers AC.

Each of the memory cell arrays MCA includes a plurality of memory cells MC that are arranged, for example, two-dimensionally in a matrix. The memory cells MC are arranged to correspond to intersections between a bit line pair (BL1 and BL2, for example) and word lines WL, respectively. That is, one end of each of the memory cells MC is connected to the BL1 that is one of the bit line pair. The other end of the memory cells MC is connected to the BL2 that is the other of the bit line pair. The bit line pair BL1 and BL2 extends in a column direction. The word lines WL extend in a row direction orthogonal to the column direction.

Each of the sense amplifiers SA is connected to the memory cells MC via the bit line BL1, for example, and functions to detect data stored in each of the memory cells MC. A write driver WD is connected to the memory cells MC via the bit lines BL1 and BL2, for example, and functions to write data to each of the memory cells MC.

The main data controller MDC transfers data received from the DQ buffer DQB to the write driver WD so as to write the data to a desired column under control of the column controller CC. Alternatively, the main data controller MDC transfers data read from a desired column to the DQ buffer DQB under control of the column controller CC.

The DQ buffer DQB that serves as a data buffer temporarily holds read data detected by each of the sense amplifiers SA and outputs the read data to the outside of a memory chip 1. Alternatively, the DQ buffer DQB temporarily holds write data received via a DQ pad DQ and transfers the write data to the write driver WD.

The column controller CC controls the sense amplifiers SA or the write driver WD to operate so as to selectively drive one of the bit lines BL in a desired column in response to a column address.

The row controller RC controls a word line driver WLD to operate so as to selectively drive a desired word line WL in response to a row address.

The clock buffer CLKB receives a clock signal for determining timing of operations of the entire memory chip 1.

The command controller CMD receives commands indicating various operations such as a data read operation and a data write operation, and controls the column controller CC and the row controller RC in response to those commands, respectively.

The address controller ADDC receives row addresses, column addresses, and the like, decodes these addresses, and transmits these addresses to the column controller CC and the row controller RC, respectively.

Each of the array controllers AC controls the entirety of each of the corresponding memory cell arrays MCA.

Figure 2:
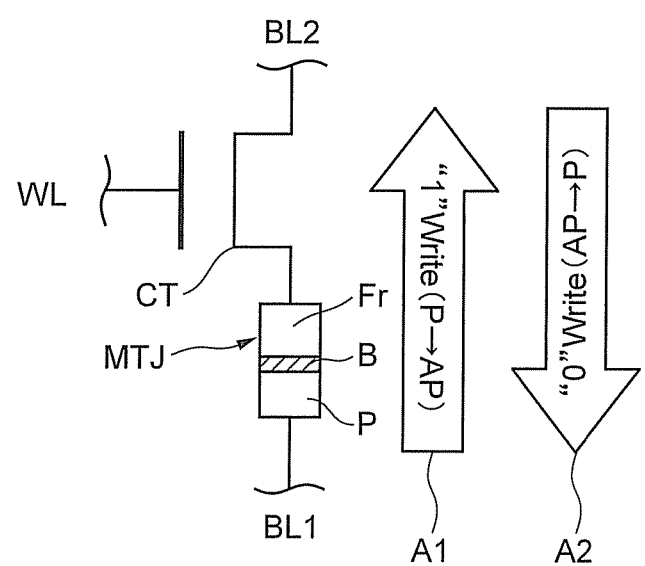
FIG. 2 is an explanatory diagram showing a configuration of one of the memory cells MC.

FIG. 2 is an explanatory diagram showing a configuration of one of the memory cells MC. Each memory cell MC includes a magnetic tunnel junction (MTJ) element and a cell transistor CT. The MTJ element is an STT-MTJ element. The MTJ element and the cell transistor CT are connected in series between the bit lines BL1 and BL2. In the memory cell MC, the cell transistor CT is arranged near the bit line BL2 and the MTJ element is arranged near the bit line BL1. A gate of the cell transistor CT is connected to one word line WL.

The STT-MTJ element that uses the TMR (tunneling magnetoresistive) effect has a stacking structure including two ferromagnetic layers and a nonmagnetic layer (an insulating thin film) sandwiched between the two ferromagnetic layers. The STT-MTJ element stores digital data according to a change in a magnetic resistance due to the spin-polarized tunneling effect. The MTJ element can be made into a low resistance state and a high resistance state depending on magnetization arrangements of the two ferromagnetic layers. For example, if it is defined that the low resistance state is data "0" and that the high resistance state is data "1", one-bit data can be recorded in the MTJ element. Needless to say, it can be defined that the low resistance state is the data "1" and that the high resistance state is the data "0". For example, as shown in FIG. 2, the MTJ element is formed by sequentially stacking a pinned layer P, a tunnel barrier layer B, and a recording layer Fr. The pinned layer P and the recording layer Fr are made of a ferromagnetic material and the tunnel barrier layer B is made of an insulating film. The pinned layer P is a layer having a fixed magnetization direction, the recording layer Fr has a variable magnetization direction, and the MTJ element stores data depending on the magnetization directions of the pinned layer P and the recording layer Fr.

When a current equal to or higher than an inversion threshold current flows in an arrow A1 direction during the write operation, then the magnetization direction of the recording layer Fr becomes anti-parallel (Parallel P to Anti-Parallel AP) to that of the pinned layer P, and the MTJ element is made into the high resistance state (data "1"). When the current equal to or higher than the inversion threshold current flows in an arrow A2 direction during the write operation, the magnetization direction of the recording layer Fr becomes parallel (Anti-Parallel AP to Parallel P) to that of the pinned layer P, and the MTJ element is made into the low resistance state (data "0"). In this way, different data can be written to the MTJ element depending on a current direction.

In the MRAM, during the data read operation, each of the sense amplifiers SA detects a resistance difference among the memory cells MC by supplying a current (a cell current) to the memory cells MC. At this time, the cell current is a current lower than the inversion threshold current used during the data write operation. A read current is, therefore, inevitably quite low.

Examples of the sense amplifiers SA include a constant-current-type sense amplifier and a constant-voltage-clamp-type sense amplifier, and the like. If the constant-current-type sense amplifiers are used, a voltage difference (a signal difference) between the data "0" and the data "1" is several tens of millivolts (mV). If the constant-voltage-clamp-type sense amplifiers are used, a current ratio (a signal ratio) of the data "0" to the data "1" is several microamperes (μA).

It is necessary to detect data with high accuracy so as to detect such a subtle signal difference. For the highly accurate data detection, it is necessary to use appropriate reference data that is set near a center between the data "1" and the data "0". To generate such appropriate reference data, a configuration shown in FIG. 3 is used according to the present embodiment.

Figure 3:
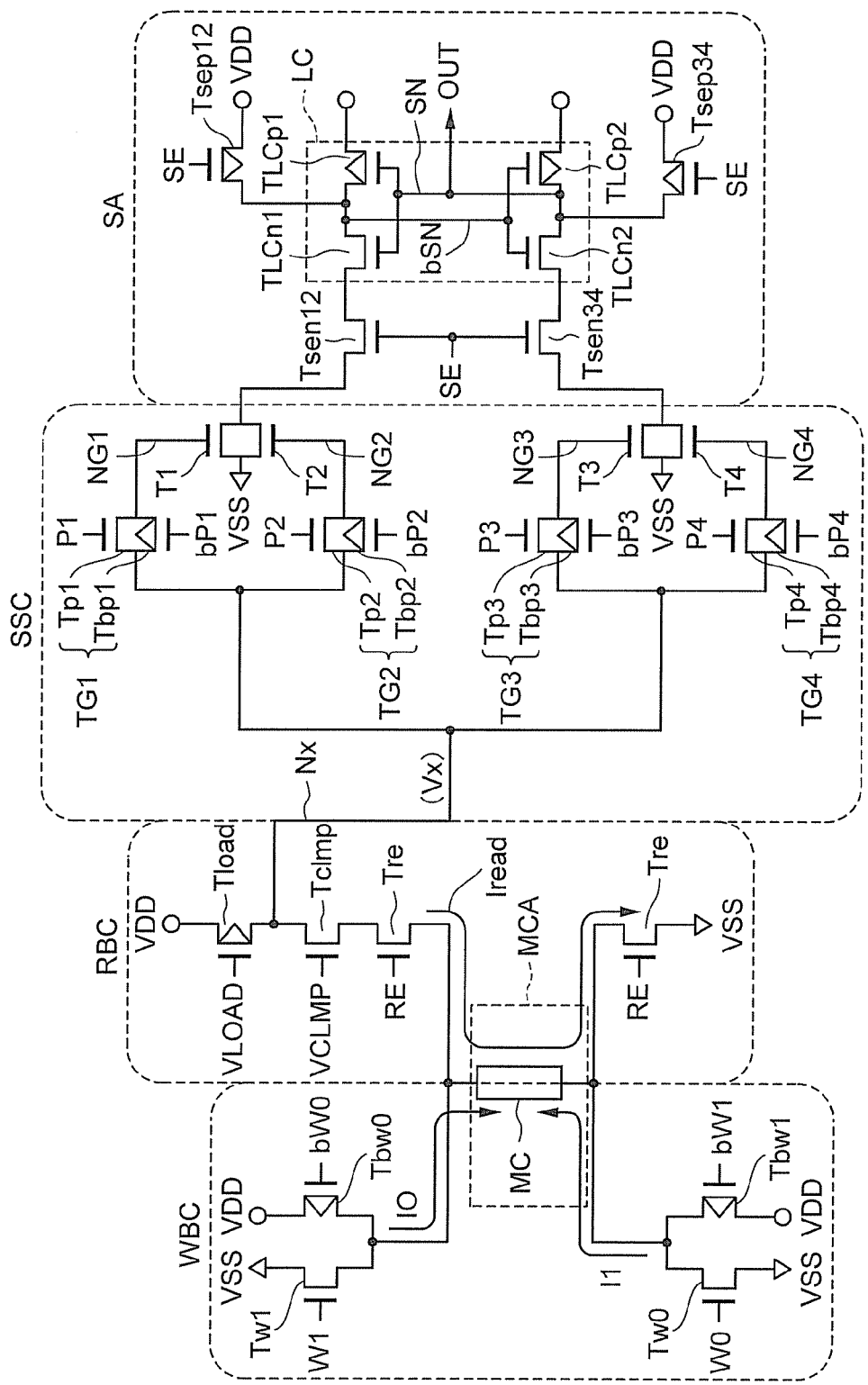
FIG. 3 is a circuit diagram showing a schematic configuration of the MRAM according to the present embodiment.

FIG. 3 is a circuit diagram showing a schematic configuration of the MRAM according to the present embodiment. FIG. 3 shows the memory cell MC selected within one memory cell array MCA and circuits connected to the selected memory cell MC during the data read operation. The other unselected memory cells MC, the word lines WL, and the bit lines BL are not shown in FIG. 3.

The MRAM according to the present embodiment includes the memory cell arrays MCA, a write bias circuit WBC, a read bias circuit RBC, a signal holding circuit SSC, and the sense amplifiers SA.

The write bias circuit WBC includes n-transistors Tw0 and Tw1 and p-transistors Tbw0 and Tbw1. The transistors Tw0 and Tbw0 are transistors that become conductive when the data "0" is written to the selected memory cell MC. Gate signals W0 and bW0 of the transistors Tw0 and Tbw0 are complementary to each other, and the transistors Tw0 and Tbw0 are driven simultaneously in response to the gate signals W0 and bW0, respectively. The transistors Tw1 and Tbw1 are transistors that become conductive when the data "1" is written to the selected memory cell MC. Gate signals W1 and bW1 of the transistors Tw1 and Tbw1 are complementary to each other, and the transistors Tw1 and Tbw1 are driven simultaneously in response to the gate signals W1 and bW1, respectively.

When the transistors Tw0 and Tbw0 are conductive, a current T0 flows to the selected memory cell MC and the data "0" is written to the selected memory cell MC. When the transistors Tw1 and Tbw1 are conductive, a current I1 flows to the selected memory cell MC and the data "1" is written to the selected memory cell MC.

The read bias circuit RBC includes two n-transistors Tre, an n-transistor Tclmp and a p-transistor Tload. The transistor Tre is a transistor that becomes conductive during the data read operation. The transistor Tre is controlled by a read enable signal RE. The transistor Tclmp is a transistor that determines a voltage to be applied to the selected memory cell MC when the data is read. The transistor Tclmp is controlled by a clamp signal VCLMP to become conductive during the data read operation. The transistor Tload is a transistor that determines a voltage Vx of a node Nx. The transistor Tload is controlled by a load signal VLOAD to become conductive during the data read operation.

The node Nx between the transistors Tload and Tclmp is connected to the signal holding circuit SSC. The voltage Vx of the node Nx is transmitted to the signal holding circuit SSC as a signal in response to the data stored in the selected memory cell MC.

During the data read operation, the read bias circuit RBC applies a predetermined voltage to the selected memory cell MC and carries a current Iread to the selected memory cell MC. At this time, the read bias circuit RBC applies the voltage Vx of the node Nx to the signal holding circuit SSC.

The signal holding circuit SSC includes n-transistors Tp1 to Tp4, p-transistors Tbp1 to Tbp4, and n-transistors (hereinafter, also "first to fourth transistors") T1 to T4. The transistors Tp1 and Tbp1 are connected to each other in parallel. The transistors Tp1 and Tbp1 thereby function as a first transfer gate TG1 that transfers the voltage Vx to a gate electrode (a gate node) NG1 of the transistor T1. The transistors Tp2 and Tbp2 are connected to each other in parallel. The transistors Tp2 and Tbp2 thereby function as a second transfer gate TG2 that transfers the voltage Vx to a gate electrode (a gate node) NG2 of the transistor T2. The transistors Tp3 and Tbp3 are connected to each other in parallel. The transistors Tp3 and Tbp3 thereby function as a third transfer gate TG3 that transfers the voltage Vx to a gate electrode (a gate node) NG3 of the transistor T3. The transistors Tp4 and Tbp4 are connected to each other in parallel. The transistors Tp4 and Tbp4 thereby function as a fourth transfer gate TG4 that transfers the voltage Vx to a gate electrode (a gate node) NG4 of the transistor T4.

Gate signals P1 and bP1 are complementary to each other. The first transfer gate TG1 is driven in response to the gate signals P1 and bP1. Gate signals P2 and bP2 are complementary to each other. The second transfer gate TG2 is driven in response to the gate signals P2 and bP2. Gate signals P3 and bP3 are complementary to each other. The third transfer gate TG3 is driven in response to the gate signals P3 and bP3. Gate signals P4 and bP4 are complementary to each other. The fourth transfer gate TG4 is driven in response to the gate signals P4 and bP4.

The gate electrode NG1 of the first transistor T1 is connected to the node Nx via the first transfer gate TG1. The gate electrode NG2 of the second transistor T2 is connected to the node Nx via the second transfer gate TG2. The first transistor T1 and the second transistor T2 are connected to each other in parallel.

Drains of the first transistor T1 and the second transistor T2 are connected to a sense node bSN of one of the sense amplifiers SA via a transistor Tsen12 and the like.

The gate electrode NG3 of the third transistor T3 is connected to the node Nx via the third transfer gate TG3. The gate electrode NG4 of the fourth transistor T4 is connected to the node Nx via the fourth transfer gate TG4. The third transistor T3 and the fourth transistor T4 are connected to each other in parallel.

Drains of the third transistor T3 and the fourth transistor T4 are connected to a sense node SN of one of the sense amplifiers SA via a transistor Tsen34 and the like.

The signal holding circuit SSC configured as described above can hold the voltage Vx of the node Nx in one of the gate nodes NG1 to NG4 by controlling the transfer gates TG1 to TG4.

Each of the sense amplifiers SA includes the n-transistors Tsen12 and Tsen34, p-transistors Tsep12 and Tsep34, and a latch circuit LC.

The transistor Tsen12 is connected between the drains of the transistors T1, T2 of the signal holding circuit SSC and the latch circuit LC. The transistor Tsen34 is connected between the drains of the transistors T3, T4 of the signal holding circuit SSC and the latch circuit LC. The transistors Tsen12 and Tsen34 commonly receive a sense enable signal SE, and are driven simultaneously in response to the sense enable signal SE.

The latch circuit LC includes n-transistors TLCn1 and TLCn2 and p-transistors TLCp1 and TLCp2.

The transistors TLCn1 and TLCp1 are directly connected between a power supply voltage VDD and the transistor Tsen12. Gate electrodes of the transistors TLCn1 and TLCp1 are commonly connected to the sense node SN that is present between the transistors TLCn2 and TLCp2.

The transistors TLCn2 and TLCp2 are directly connected between the power supply voltage VDD and the transistor Tsen34. Gate electrodes of the transistors TLCn2 and TLCp2 are commonly connected to the sense node bSN that is present between the transistors TLCn1 and TLCp1.

In this way, the gate electrodes of the transistors TLCn1 and TLCp1 are cross-coupled to those of the transistors TLCn2 and TLCp2.

The sense node bSN between the transistors TLCn1 and TLCp1 is connected to the power supply voltage VDD via the transistor Tsep12. The sense node SN between the transistors TLCn2 and TLCp2 is connected to the power supply voltage VDD via the transistor Tsep34.

The sense amplifier SA configured as described above can amplify a voltage difference between a voltage obtained via the transistor Tsen12 and a voltage obtained via the transistor Tsen34, and latch the voltage difference to the sense nodes SN And bSN of the latch circuit LC. The sense amplifier SA outputs the voltage held in the sense node SN as a detection result OUT. VSS is a ground voltage, for example.

Operations of the MRAM according to the present embodiment are explained next.

Figure 4:
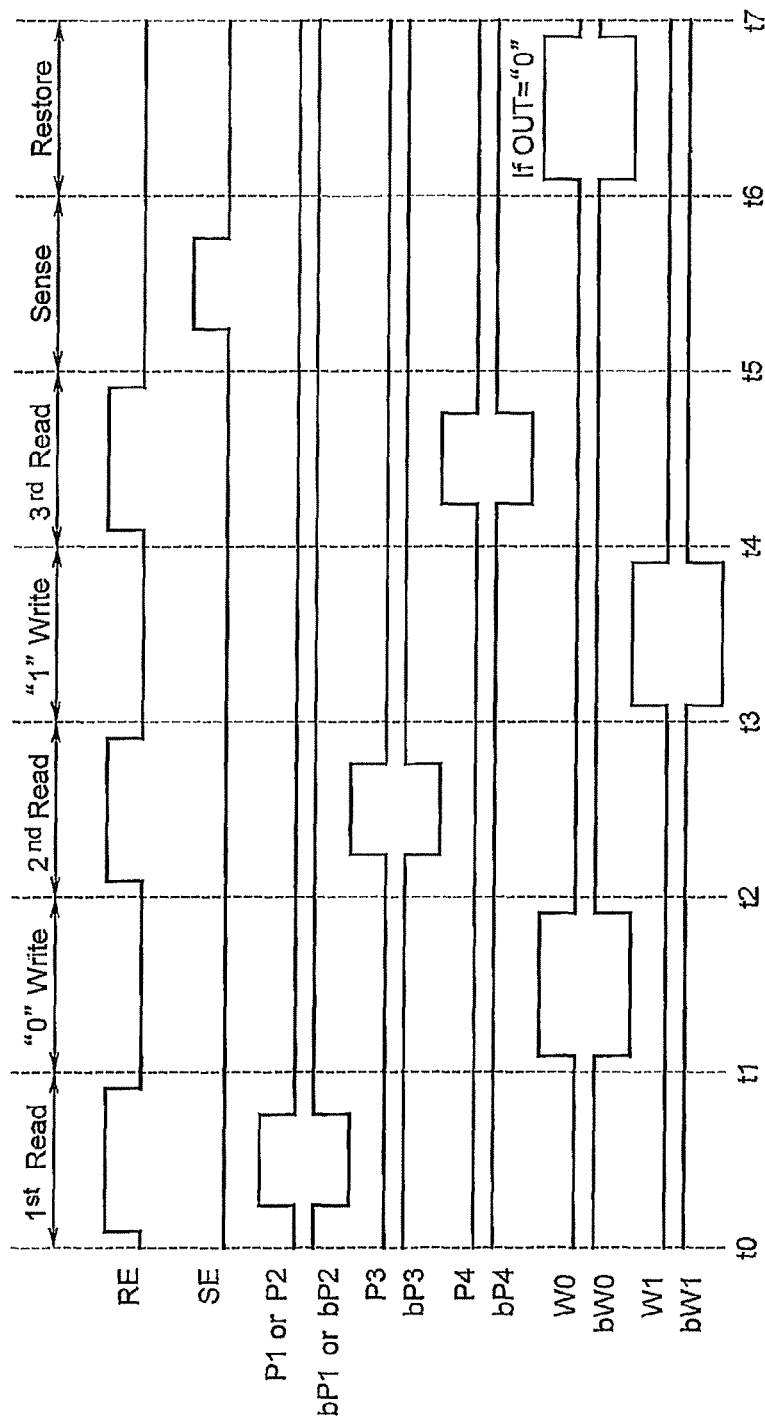
FIG. 4 is a timing diagram showing the data read operation performed by the MRAM according to the present embodiment.
Figure 5:
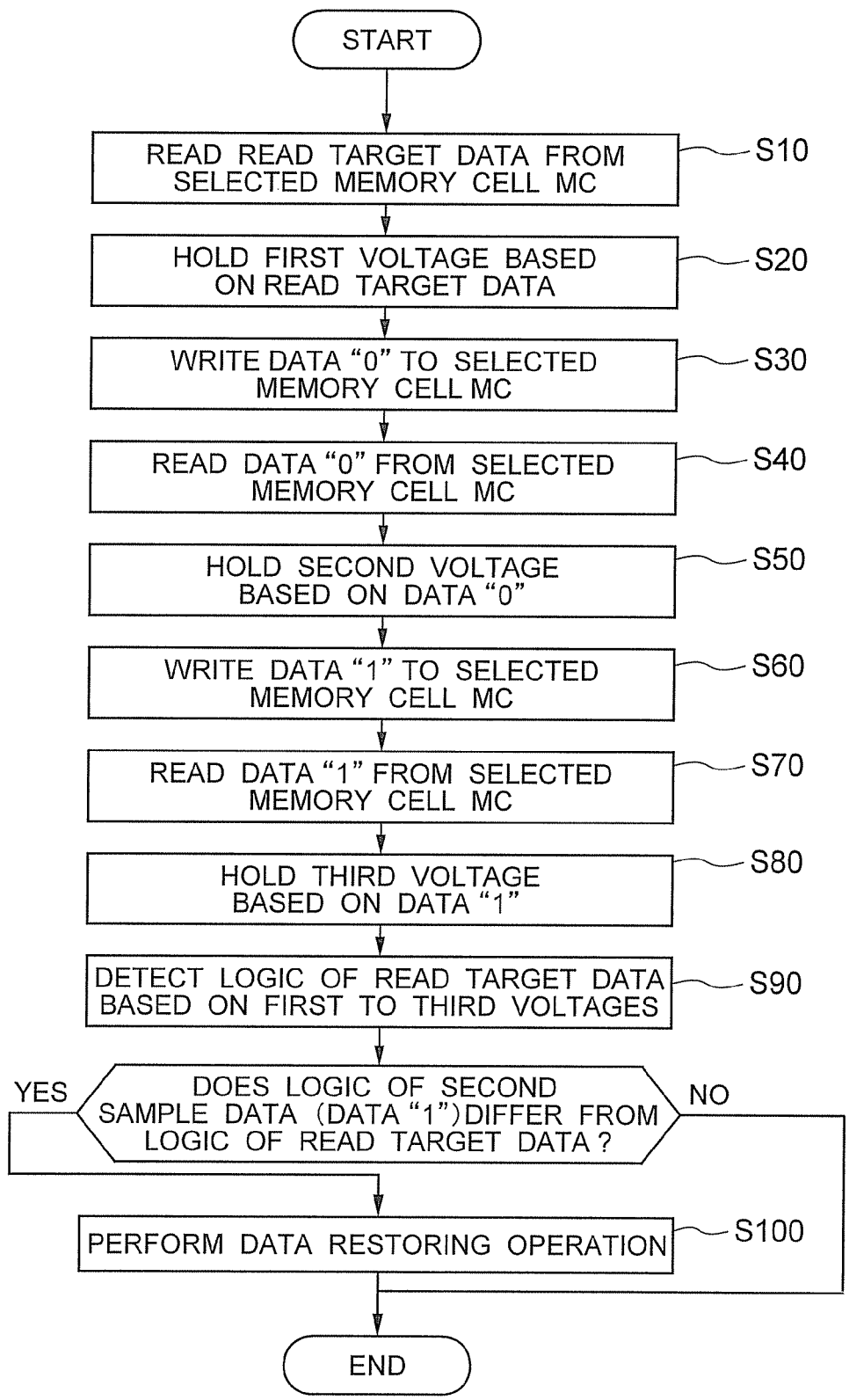
FIG. 5 is a flowchart showing the data read operation performed by the MRAM according to the present embodiment.

FIG. 4 is a timing diagram showing the data read operation performed by the MRAM according to the present embodiment. FIG. 5 is a flowchart showing the data read operation performed by the MRAM according to the present embodiment. The selected memory cell MC that serves as a first storage element stores data of a certain logic as read target data. The MRAM detects the read target data stored in the selected memory cell MC according to a data read sequence shown in FIG. 4. Note that the transistors Tload and Tclmp shown in FIG. 3 are kept conductive during the data read operation.

First, from t0 to t1, the MRAM performs a first read operation (S10). During the first read operation, the signal holding circuit SSC holds a first voltage based on the read target data stored in the selected memory cell MC (S20).

More specifically, the read enable signal RE is activated to logical high. The read bias circuit RBC shown in FIG. 3 thereby carries a read current Iread to the selected memory cell MC. Furthermore, the gate signals P1 and P2 are activated to logical high. The gate signals bP1 and bP2 are activated to logical low, accordingly. The first and second transfer gates TG1 and TG2 shown in FIG. 3 thereby become conductive. The first voltage according to the read target data is transmitted to the gate nodes NG1 and NG2 via the first and second transfer gates TG1 and TG2, respectively.

The gate signals P1 and P2 are then deactivated to logical low, and the gate signals bP1 and bP2 are deactivated to logical high. The first and second transfer gates TG1 and TG2 thereby become nonconductive. The first voltage is thereby held in the gate nodes NG1 and NG2.

Next, from t1 to t2, the MRAM performs a data write operation (first write operation) for writing the data "0" that serves as first sample data (S30). During the data "0" write operation, the write bias circuit WBC writes the data "0" to the selected memory cell MC.

More specifically, the gate signal W0 of the transistor Tw0 shown in FIG. 3 is activated to logical high, and the gate signal bW0 of the transistor Tbw0 shown in FIG. 3 is activated to logical low. The write bias circuit WBC shown in FIG. 3 thereby carries the current I0 to the selected memory cell MC and writes the data "0" to the selected memory cell MC.

At this time, the write bias circuit WBC overwrites the data "0" on the read target data in the selected memory cell MC. However, no problems occur because information on the read target data is held in the signal holding circuit SSC as the first voltage.

From t2 to t3, the MRAM performs a second read operation (S40). During the second read operation, the signal holding circuit SSC holds a second voltage based on the data "0" stored in the selected memory cell MC (S50).

More specifically, the read enable signal RE is activated to logical high. The read bias circuit RBC thereby carries the read current Tread to the selected memory cell MC. Further-more, the gate signal P3 is activated to logical high. The gate signal bP3 is activated to logical low, accordingly. The third transfer gate TG3 shown in FIG. 3 thereby becomes conductive. The second voltage according to the data "0" is transmitted to the gate node NG3 via the third gate transfer gate TG3.

The gate signal P3 is deactivated to logical low and the gate signal bP3 is deactivated to logical high. The third transfer gate TG3 thereby becomes nonconductive. The second voltage is thereby held in the gate node NG3.

From t3 to t4, the MRAM performs a data write operation (second write operation) for writing the data "1" that serves as second sample data (S60). During the data "1" write operation, the write bias circuit WBC writes the data "1" to the selected memory cell MC.

More specifically, the gate signal W1 of the transistor Tw1 shown in FIG. 3 is activated to logical high, and the gate signal bW1 of the transistor Tbw1 shown in FIG. 3 is activated to logical high. The write bias circuit WBC shown in FIG. 3 thereby carries the current I1 to the selected memory cell MC and writes the data "1" to the selected memory cell MC.

At this time, the write bias circuit WBC overwrites the data "1" on the data "0" in the selected memory cell MC. However, no problems occur because information on the data "0" is held in the signal holding circuit SSC as the second voltage.

From t4 to t5, the MRAM performs a third data read operation (S70). During the third data read operation, the signal holding circuit SSC holds a third voltage based on the data "1" stored in the selected memory cell MC (S80).

More specifically, the read enable signal RE is activated to logical high. The read bias circuit RBC thereby carries the read current Iread to the selected memory cell MC. Furthermore, the gate signal P4 is activated to logical high. The gate signal bP4 is activated to logical low, accordingly. The fourth transfer gate TG4 shown in FIG. 3 thereby becomes conductive. The third voltage according to the data "1" is transmitted to the gate node NG4 via the fourth transfer gate TG4.

The gate signal P4 is deactivated to logical low and the gate signal bP4 is deactivated to logical high. The fourth transfer gate TG4 thereby becomes nonconductive. The third voltage is thereby held in the gate node NG4.

At this time, the signal holding circuit SSC holds the first voltage corresponding to the read target data in the gate nodes NG1 and NG2, the second voltage corresponding to the data "0" in the gate node NG3, and the third voltage corresponding to the data "1" in the gate node NG4. Therefore, the first voltage is applied to the gate electrodes (NG1 and NG2) of the first and second transistors T1 and T2. The second voltage is applied to the gate electrode (NG3) of the third transistor T3. The third voltage is applied to the gate electrode (NG4) of the fourth transistor T4.

Figure 6A:
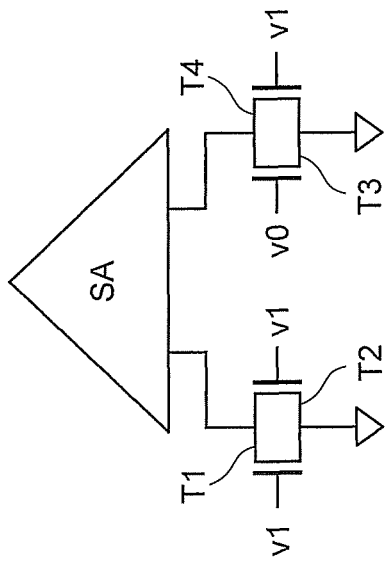
FIGS. 6A and 6B are schematic diagrams of the signal holding circuit SSC and the sense amplifier SA.
Figure 6B:
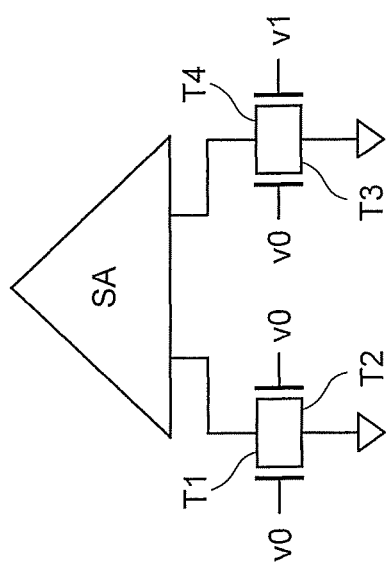

FIGS. 6A and 6B simply show states of the signal holding circuit SSC that is holding the first to third voltages and those of the sense amplifier SA.

FIG. 6A is a schematic diagram of the signal holding circuit SSC and the sense amplifier SA when the read target data is the data "0". FIG. 6B is a schematic diagram of the signal holding circuit SSC and the sense amplifier SA when the read target data is the data "1". Symbol V0 denotes a voltage held in the gate nodes NG1 to NG4 when the data "0" is stored in the selected memory cell MC. Symbol V1 denotes a voltage held in the gate nodes NG1 to NG4 when the data "1" is stored in the selected memory cell MC.

As shown in FIG. 6A, when the read target data is the data "0", the voltage V0 is applied to the gate electrodes (NG1 and NG2) of the first and second transistors T1 and T2 as the first voltage. On the other hand, as shown in FIG. 6B, when the read target data is the data "1", the voltage V1 is applied to the gate electrodes (NG1, and NG2) of the first and second transistors T1 and T2 as the first voltage. The voltage V0 is applied to the gate electrode (NG3) of the third transistor T3 as the second voltage in either a case shown in FIG. 6A or that shown in FIG. 6B. The voltage V1 is applied to the gate electrode (NG4) of the fourth transistor T4 as the third voltage in either the case shown in FIG. 6A or that shown in FIG. 6B.

In this way, conductive states of the third and fourth transistors T3 and T4 do not change depending on the logic of the read target data; however, conductive states of the first and second transistors T1 and T2 change depending on the logic of the read target data.

Therefore, at the time point of t5 shown in FIG. 4, the first and second transistors T1 and T2 are in the conductive states (or nonconductive states) according to the first voltage that corresponds to the read target data. Therefore, the first and second transistors T1 and T2 can apply a read signal to the sense amplifier SA based on the first voltage.

The third transistor T3 is in the conductive state (or the nonconductive state) according to the second voltage that corresponds to the data "0". The fourth transistor 14 is in the conductive state (or the nonconductive state) according to the third voltage that corresponds to the data "1".

Herein, because the third and fourth transistors T3 and T4 are connected in parallel, the conductive states of the third and fourth transistors T3 and T4 are an intermediate conductive state that corresponds to intermediate data between the data "0" and the data "1". Therefore, the third and fourth transistors 13 and 14 can apply a reference signal that is in between the second and third voltages to the sense amplifier SA. The reference signal is an intermediate signal that is obtained according to the intermediate conductive states of the third and fourth transistors T3 and T4 by an intermediate voltage between the second and third voltages.

As shown in FIG. 4, from t5 to t6, the sense amplifier SA detects the logic of the read target data (S90). More specifically, the sense enable signal SE is activated to logical high, thereby making the transistors Tsen12 and Tsen34 into conductive states. The transistors Tsep12 and Tsep34 are conductive when the sense enable signal SE is deactivated to logical low. Therefore, the sense nodes SN and bSN are precharged with the power supply voltage VDD. At this time, the transistors TLCn1 and TLCn2 are conductive whereas the transistors TLCp1 and TLCp2 are nonconductive.

By activating the sense enable signal SE to logical high, the transistors Tsen12 and Tsen34 become conductive and the transistors Tsep12 and Tsep34 become nonconductive. The power supply voltage VDD is thereby disconnected from the sense nodes SN and bSN. The voltage of the sense node bSN changes to a voltage according to the conductive states of the first and second transistors T1 and T2. The voltage of the sense node SN changes to a voltage according to the conductive states of the third and fourth transistors T3 and T4.

That is, the read signal based on the read target data (the first voltage) is transmitted to the sense node bSN. The reference signal based on the intermediate data (the intermediate voltage between the second and third voltages) is transmitted to the sense node SN.

The latch circuit LC compares the voltage of the sense node bSN with that of the sense node SN, amplifies the voltage difference, and latches the voltage difference. The sense amplifier SA can thereby detect the read target data.

Thereafter, from t6 to t7, the MRAM performs a data restoring operation as needed (S100). When the second sample data differs in logic from the read target data, the write bias circuit WBC needs to write back the data having the same logic as that of the read target data to the selected memory cell MC.

For example, at the time point of t6, the selected memory cell MC stores the data "1" as the second sample data. Therefore, if the read target data is the data "0", the write bias circuit WBC needs to write back the data "0" to the selected memory cell MC from t6 to t7. This data "0" write operation is the same as the data "0" write operation (first write operation) performed from t1 to t2. If the read target data is the data "1", there is no need to perform the data restoring operation.

In this way, according to the present embodiment, the signal holding circuit SSC holds the first voltage based on the read target data, the second voltage based on the data "0", and the third voltage based on the data "1". The signal holding circuit SSC applies the read signal to the sense amplifier SA based on the first voltage, and applies the reference signal to the sense amplifier SA based on the second and third voltages. The sense amplifier SA compares the read signal with the reference signal, thereby the sense amplifier SA detects the logic of the read target data stored in the selected memory cell MC.

It is possible to set each of the first and second sample data to have a logic opposite to the logic described above. That is, the data "1" can be used as the first sample data and the data "0" can be used as the second sample data. In this case, the data restored from t6 to t7 has a logic opposite to the logic described above.

The MRAM according to the present embodiment generates the reference signal by using the data "0" that is actually stored in the selected memory cell MC and the data "1" that is actually stored in the selected memory cell MC. The reference signal is used to detect the read target data stored in the same selected memory cell MC. That is, according to the present embodiment, the sense amplifier SA detects the read target data by a self-referencing method. Therefore, the reference signal can be set to be closer to the center between the data "1" and the data "0", even if characteristics of the MTJ elements, those of the cell transistors CT, and those of the transistors that constitute the signal holding circuit SSC and the sense amplifiers SA are varied by process irregularities. The MRAM according to the present embodiment can detect fine signals obtained from the MTJ elements with high accuracy.

FIGS. 7A to 7C are graphs for explaining respective reference signals generated in the MRAM according to the present embodiment and MRAMs according to comparative examples of the present embodiment. FIG. 7A shows the reference signal generated in the MRAM according to the present embodiment. FIG. 7B shows the reference signal generated by using a reference cell as one of the comparative examples. FIG. 7C shows the reference signal generated by using the self-referencing method as the other comparative example.

In FIG. 7B, the reference signal is generated by using the reference cell different from the selected memory cell MC that actually stores therein the read target data. Therefore, the reference signal is preferably in between a signal distribution of the data "0" and that of the data "1". However, the signal distributions of the data "0" and the data "1" have spread to some extent according to normal distributions, respectively. Therefore, a margin between a reference signal Vref and the data "0" and that between the reference signal Vref and the data "1" are narrow.

With the self-referencing method shown in FIG. 7C, the voltage based on the read target data read from the selected memory cell MC is held first. Sample data of a predetermined logic is then written to the selected memory cell MC, and the sample data is read again from the selected memory cell MC. Next, an offset voltage Vos is added to or subtracted from the sample data that is read second. The sense amplifier SA compares the reference signal obtained in this way with the read target data that is read first, thereby detecting the read target data.

However, the reference signal generated as shown in FIG. 7C is sensitive to the process irregularities similarly to the conventional techniques because the offset voltage Vos is set irrespectively of the characteristics of the actual MTJ elements, cell transistors CT, and the like.

On the other hand, in a case of the MRAM according to the present embodiment, information used to obtain the reference signal is all obtained from the actually selected memory cell MC. Accordingly, as shown in FIG. 7A, even if the characteristics of the selected memory cell MC, the cell transistor CT, and the like vary according to the processes, the reference signal changes according to the irregularities.

For example, it is assumed that a signal read from a selected memory cell MC1 that stores the data "0" is MC1_0, and that a signal read from the selected memory cell MC1 that stores the data "1" is MC1_1. In this case, the reference signal is Vref1 near a center between the MC1_0 and MC1_1. It is also assumed that a signal read from a selected memory cell MC2 that stores the data "0" is MC2_0, and that a signal read from the selected memory cell MC2 that stores the data "1" is MC2_1. In this case, the reference signal is Vref2 near a center between the MC2_0 and MC2_1. In this way, in the case of the MRAM according to the present embodiment, not only the read target data but also the reference signal Vref change according to the irregularities of the characteristics of the actually selected memory cell MC and peripheral elements of the selected memory cell MC. Therefore, in the MRAM according to the present embodiment, it is possible to obtain the reference signal from which the influence of the process irregularities is eliminated. As a result, the MRAM according to the present embodiment can read data with high accuracy even if the characteristics of the memory cells MC and the like have irregularities.

The MRAM according to the present embodiment needs to perform the three data read operations and the two data write operations so as to detect the target data stored in the selected memory cell MC. However, an operating speed of the MRAM is much higher than that of a NAND flash memory, for example. Furthermore, unlike the NAND flash memory, the MRAM has no limitation to the number of rewritable times. Therefore, it can be said that a read method according to the present embodiment is suitable for resistive random access memories such as the MRAM.

(Second Embodiment)

Figure 8:
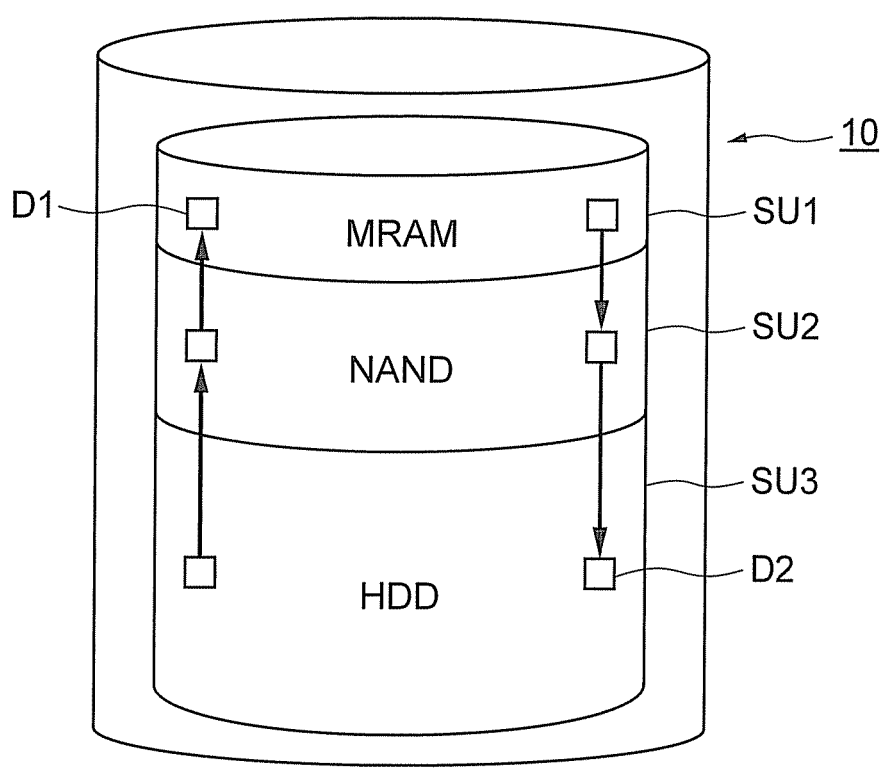
FIG. 8 is a conceptual diagram showing a configuration of a storage system 10 according to a second embodiment.

FIG. 8 is a conceptual diagram showing a configuration of a storage system 10 according to a second embodiment. The storage system 10 includes a first storage unit SU1 that includes an MRAM, a second storage unit SU2 that includes a NAND flash memory (hereinafter, also "NAND memory"), and a third storage unit SU3 that includes a hard disk drive (HDD). The MRAM using the self-referencing method according to the first embodiment can be used as the MRAM included in the first storage unit SU1.

Although being hierarchized, the first to third storage units SU1 to SU3 can store data therein as the single storage system 10.

Figure 9:
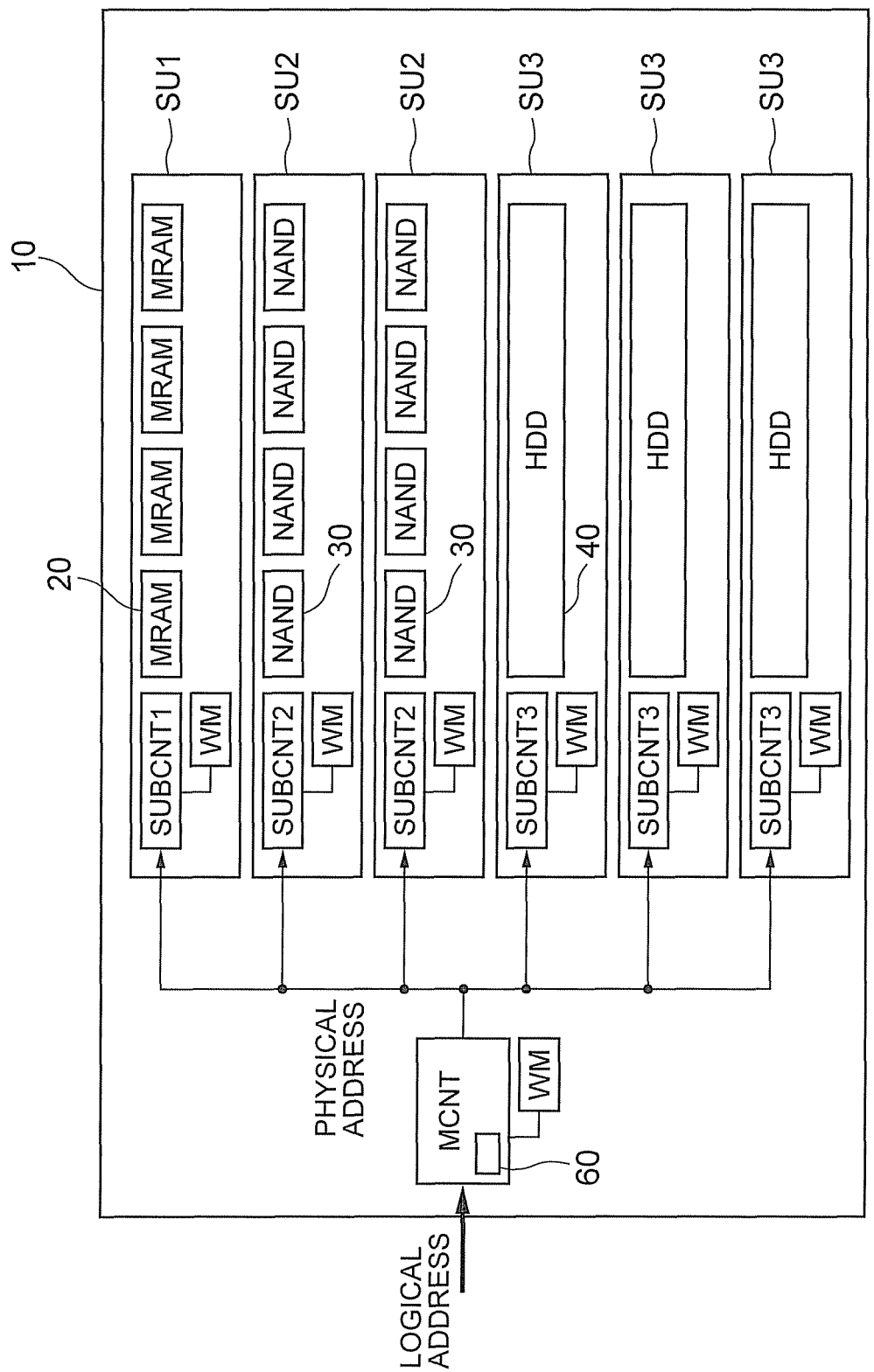
FIG. 9 is a block diagram showing the configuration of the storage system 10 according to the second embodiment.

FIG. 9 is a block diagram showing the configuration of the storage system 10 according to the second embodiment. The first storage unit SU1 includes a plurality of MRAM chips 20 and a first sub-controller SUBCNT1. The first sub-controller SUBCNT1 controls the MRAM chips 20 during a data read or data write operation. While the number of first storage units SU1 is one in FIG. 9, the number of first storage units SU1 is not limited to one.

Each of the second storage units SU2 includes a plurality of NAND flash memory chips (hereinafter, also "NAND chips") 30 and a second sub-controller SUBCNT2. The second sub-controller SUBCNT2 controls the NAND chips 30 during a data read or data write operation. While the number of second storage units SU2 is two in FIG. 9, the number of second storage units SU2 is not limited to two.

Each of the third storage units SU3 includes an HDD 40 and a third sub-controller SUBCNT3. The third sub-controller SUBCNT3 controls the HDD 40 during a data read or data write operation. While the number of third storage units SU3 is three in FIG. 9, the number of third storage units SU1 is not limited to three.

The first to third sub-controllers SUBCNT1 to SUBCNT3 control the first to third storage units SU1 to SU3 individually.

The storage system 10 also includes a master controller MCNT for controlling the first to third sub-controllers SUBCNT1 to SUBCNT3 of the first to third storage units SU1 to SU3.

The master controller MCNT holds an address conversion table for converting a logical address of input/output data into one of physical addresses of any one of the first to third storage units SU1 to SU3, when the storage system 10 is accessed during the data read or data write operation. The address conversion table is a table showing a correspondence between logical addresses of input/output data and the physical addresses of the first to third storage units SU1 to SU3. The master controller MCNT stores therein the address conversion table in a register 60. The master controller MCNT can change the relationship (or correspondence) between the logical addresses and the physical addresses in the address conversion table, depending on access frequency.

Figure 10:
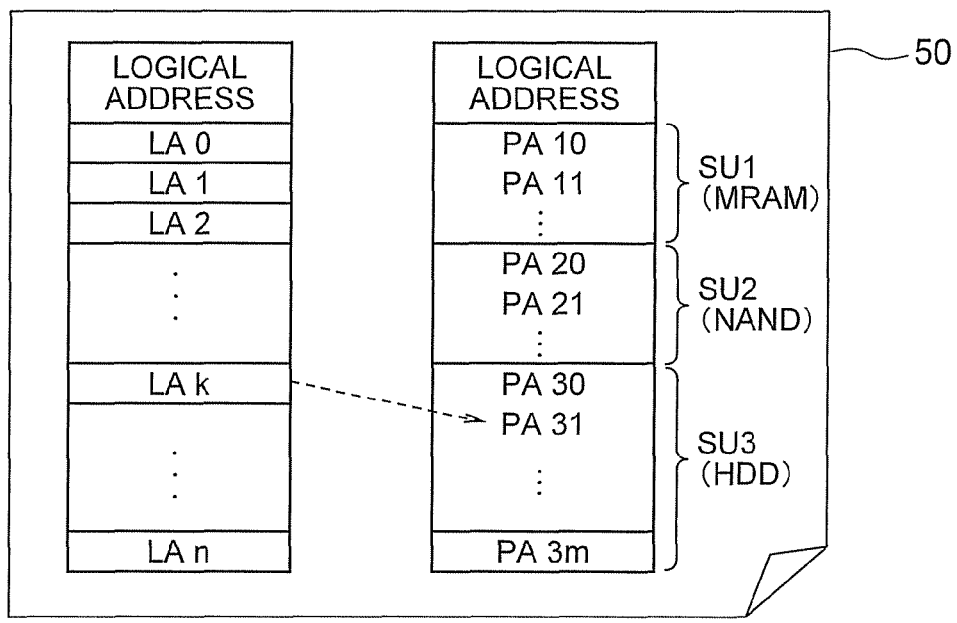
FIG. 10 is a conceptual diagram showing a configuration of an address conversion table 50.

FIG. 10 is a conceptual diagram showing a configuration of an address conversion table 50. The address conversion table 50 includes information on logical addresses LA0 to LAn (n is an integer) and information on physical addresses PA10, PA11, PA12 . . . , PA20, PA21, PA22, . . . , PA30, PA31, PA32 . . . . The physical addresses PA10, PA11, PA12 . . . are addresses allocated to the first storage unit SU1. The physical addresses PA20, PA21, PA22 . . . are addresses allocated to the second storage unit SU2. The physical addresses PA30, PA31, PA32 . . . are addresses allocated to the third storage unit SU3.

Each of the logical addresses LA0 to LAn is associated with one of the physical addresses PA10, PA11, PA12 . . . , PA20, PA21, PA22 . . . , PA30, PA31, PA32 . . . . During the data read or data write operation, the master controller MCNT can thereby convert a logical address into the physical address associated with the logical address and store data in the storage unit SU1, SU2, or SU3 corresponding to the physical address. It is assumed, for example, that a logical address LAk (k=0 to n) is associated with the physical address PA31. In this case, when the storage system 10 is accessed to designate the logical address LAk, the master controller MCNT converts the logical address LAk into the physical address PA31 and accesses a storage part corresponding to the physical address PA31 of the third storage unit SU3. Furthermore, in a case of the data read operation, the third sub-controller SUBCNT3 shown in FIG. 9 reads data from the storage part corresponding to the physical address PA31 of the third storage unit SU3 to an outside of the storage system 10. In a case of the data write operation, the third sub-controller SUB- CNT3 writes write data to the storage part corresponding to the physical address PA31 of the third storage unit SU3.

The register 60 of the master controller MCNT shown in FIG. 9 also holds a data rewrite count and/or a data read count of each of the logical addresses LA0 to LAn and each of the physical addresses PA10 to PA3$m$ ($m$ is an integer). When the storage part corresponding to one of the physical addresses is accessed during the data write or data read operation, the master controller MCNT increments the data rewrite count and/or the data read count of the accessed logical address and the data rewrite count and/or the data read count of the corresponding physical address by one and holds the incremented data rewrite counts and/or the incremented data read counts in the register 60.

The master controller MCNT can be informed of access frequencies of the logical addresses LA0 to LAn and the physical addresses PA10 to PA3$m$ by the data rewrite counts and/or the data read counts of the logical addresses LA0 to LAn and the physical addresses PA10 to PA3$m$.

Generally, the MRAM is higher than the NAND memory and the HDD in a bit cost but higher than the NAND memory and the HDD in an access rate and far more superior to the NAND memory in a data rewrite count.

The HDD is lower than the NAND memory and the MRAM in an access rate but lower than both the NAND memory and the MRAM in a bit cost. Furthermore, the HDD is superior to the NAND memory in a data rewritable count.

The NAND memory is inferior to the MRAM and the HDD in a data rewritable count. However, the NAND memory is superior to the MRAM in downscaling and lower than the MRAM in a bit cost. Furthermore, the NAND memory is lower than the MRAM but far higher than the HDD in an access rate. These relations can be expressed by the following inequality expression.

Bit cost: MRAM>NAND>HDD
Access rate: MRAM>NAND>HDD
Rewritable count: HDD≈MRAM>NAND It is defined herein that the access rate is determined by a time since a command is input until data is completely output in the data read operation, and by a time since the command is input until data is completely input in the data write operation.

Taking these relations into account, the master controller MCNT of the storage system 10 according to the second embodiment moves data having a high access frequency from the HDD to the NAND memory, and moves data having a higher access frequency from the NAND memory to the MRAM. Conversely, the master controller MCNT moves data having a low access frequency from the MRAM to the NAND memory, and moves data having a lower access frequency from the NAND memory to the HDD. That is, as shown in FIG. 8, the master controller MCNT moves data D1 having a high access frequency from the third storage unit SU3 to the second storage unit SU2 and from the second storage unit SU2 to the first storage unit SU1. The master controller MCNT moves data D2 having a low access frequency from the first storage unit SU1 to the second storage unit SU2 and from the second storage unit SU2 to the third storage unit SU3.

To change data storage locations as described above, the master controller MCNT changes the physical address corresponding to the certain logical address LAk and stored in the address conversion table 50 among the first to third storage units SU1 to SU3, depending on the access frequency of the logical address LAk.

For determination of the access frequency, the master controller MCNT stores, for example, a preset first threshold related to the access frequency, a second threshold lower than the first threshold, and a predetermined period in the register 60. The access frequency is the number of accesses to each logical address in the predetermined period.

When the access frequency of the logical address LAk exceeds the first threshold, the master controller MCNT makes the logical address LAk correspond to one of the physical addresses PA10, PA11, PA12 . . . of the first storage unit SU1.

When the access frequency of the logical address LAk is equal to or lower than the first threshold and higher than the second threshold, the master controller MCNT changes the address conversion table so that the logical address LAk corresponds to one of the physical addresses PA20, PA21, PA22 . . . of the second storage unit SU2.

When the access frequency of the logical address LAk is equal to or lower than the second threshold, the master controller MCNT changes the address conversion table so that the logical address LAk corresponds to one of the physical addresses PA30, PA31, PA32 . . . of the third storage unit SU3.

Needless to mention, following the change in the physical address corresponding to the logical address LAk, the master controller MCNT moves data at the logical address LAk from the physical address originally corresponding to the logical address LAk to the physical address newly corresponding to the logical address LAk.

In this way, the master controller MCNT changes the correspondence between the logical addresses and the physical addresses in the address conversion table 50, depending on the access frequency. The storage system 10 can thereby store data in the storage unit SU1, SU2, or SU3 suitable for the access frequency while crossing over storage hierarchies of the first to third storage units SU1 to SU3. For example, the storage system 10 can be formed to store data having higher access frequencies to data having lower access frequencies in an order of MRAM, NAND, and HDD. As a result, the storage system 10 according to the second embodiment serves as a well-balanced storage system excellent in a data storage capacity, a data processing capability, and a cost performance as a whole.

Furthermore, while the storage system 10 is formed to include different types of memories, the entire storage system 10 can function virtually as one storage by using the master controller MCNT as an interface.

The address conversion table 50 is automatically changed in a background of the storage system 10 at, for example, certain intervals. More specifically, the address conversion table 50 is changed during, for example, nighttime at which the storage system 10 is accessed less frequently. During a period of changing the access conversion table 50, similarly to a period of the data write or data read operation, the master controller MCNT can output a busy signal indicating access inhibit to the outside.

In the second embodiment described above, the master controller MCNT uses the first and second thresholds so as to determine the access frequency. Alternatively, the master controller MCNT can relatively compare access frequencies of the logical addresses LA0 to LAn so as to update the address conversion table 50. For example, the master controller MCNT compares the access frequencies of the logical addresses of the first storage unit SU1 with those of the second storage unit SU2. If the access frequency of one of the logical addresses of the first storage unit SU1 is lower than the access frequencies of the logical addresses of the second storage unit SU2, it suffices that the master controller MCNT changes the correspondence between the logical addresses and the physical addresses with respect to a first logical address having the lower access frequency and allocated to the first storage unit SU1 and a second logical address having the higher access frequency and allocated to the second storage unit SU2. That is, it suffices that the master controller MCNT replaces the physical address corresponding to the first logical address of the first storage unit SU1 with that corresponding to the second logical address of the second storage unit SU2 in the address conversion table 50, depending on the access frequency. By repeating such an operation, all the access frequencies of the logical addresses of the first storage unit SU1 become higher than those of the logical addresses of the second storage unit SU2.

The master controller MCNT performs a similar operation for the second storage unit SU2 and the third storage unit SU3. Thus, all the access frequencies of the logical addresses of the second storage unit SU2 become higher than those of the logical addresses of the third storage unit SU3.

In this way, the master controller MCNT can change the correspondence between the logical addresses and the physical addresses in the address conversion table 50 by relatively comparing the access frequencies of the logical addresses LA0 to LAn.

Moreover, the storage system 10 according to the second embodiment includes the storage hierarchies, that is, the first to third storage units SU1 to SU3. However, the hierarchies of the storage system 10 are not limited to those described above. Alternatively, the storage system 10 can be configured to include, for example, two storage hierarchies of the first and second storage units SU1 and SU2. In another alternative, the storage system 10 can be configured to include two storage hierarchies of the first and third storage units SU1 and SU3. In the former alternative, the master controller MCNT suffices to change the physical addresses of the first storage unit SU1 and those of the second storage unit SU2 within the address conversion table corresponding to the logical addresses, depending on the access frequencies of the logical addresses. Even with this alternative configuration of the storage system 10, effects of the second embodiment can be ensured.

(Third Embodiment)

Figure 11:
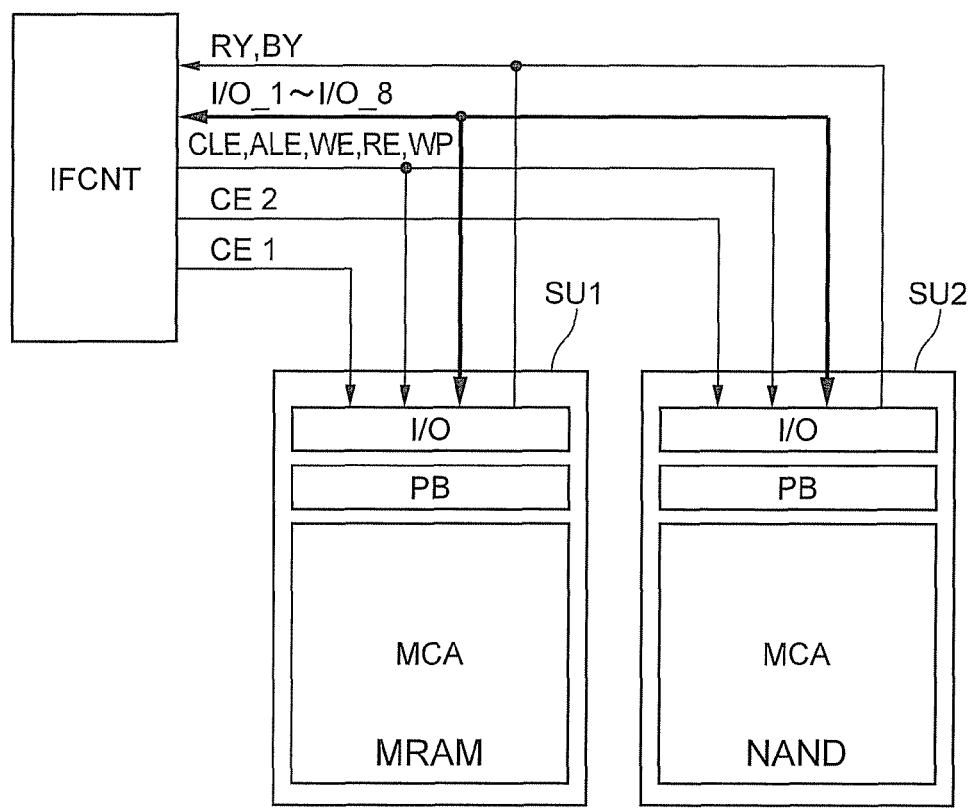
FIG. 11 is a block diagram showing a configuration of the storage system 10 according to a third embodiment.

FIG. 11 is a block diagram showing a configuration of the storage system 10 according to a third embodiment. In the third embodiment, the storage system 10 includes the MRAM as the first storage unit SU1 and the NAND memory as the second storage unit SU2. Reference symbol PB denotes a page buffer that temporarily stores read data from the memory cell array MCA and write data from the outside of the storage system 10. Reference symbol I/O denotes a data input/output circuit.

The storage system 10 also includes a common interface controller IFCNT provided commonly to the first and second storage units SU1 and SU2. The interface controller IFCNT selectively controls the first or second storage unit SU1 or SU2 during the data read or data write operation.

The first and second storage units SU1 and SU2 individually include CE pins (first input units) CE1 and CE2 to which a chip enable signal CE is input, respectively. Therefore, the first and second storage units SU1 and SU2 can be selectively activated by individually receiving the chip enable signal CE. However, input/output pins other than the CE pins CE1 and CE2 are shared between the first and second storage units SU1 and SU2 and connected commonly to the interface controller IFCNT.

For example, the MRAM as well as the NAND memory includes I/O pins (I/O1 to I/O8), a WE pin, an RE pin, a CLE pin, an ALE pin, a WP pin, an RY/BY pin, and the like. The I/O pins are used to input or output data, addresses, or commands. The WE pin is used to input a write enable signal WE. The RE pin is used to input a read enable signal RE. The CLE pin is used to input a command latch enable signal CLE. The ALE pin is used to input an address latch enable signal ALE. The WP pin is used to input a write protect signal WP. The RY/BY pin is used to output a ready signal RY or a busy signal BY. These pins are common to the MRAM and the NAND memories. This can make the interface controller IFCNT common to the first and second storage units SU1 and SU2.

When driving the first storage unit SU1, the interface controller IFCNT transmits the chip enable signal CE to the first storage unit SU1 via the CE pin CE1. The interface controller IFCNT can thereby drive the first storage unit SU1 while stopping the second storage unit SU2. In this case, the interface controller IFCNT can control the first storage unit SU1 via the common pins such as the I/O pins (I/O1 to I/O8), the WE pin, the RE pin, the CLE pin, the ALE pin, the WP pin, and the RY/BY pin.

On the other hand, when driving the second storage unit SU2, the interface controller IFCNT transmits the chip enable signal CE to the second storage unit SU2 via the CE pin CE2. The interface controller IFCNT can thereby drive the second storage unit SU2 while stopping the first storage unit SU1. In this case, the interface controller IFCNT can control the second storage unit SU2 via the common pins such as the I/O pins I/O1 to I/O8), the WE pin, the RE pin, the CLE pin, the ALE pin, the WP pin, and the RY/BY pin.

Figure 12:
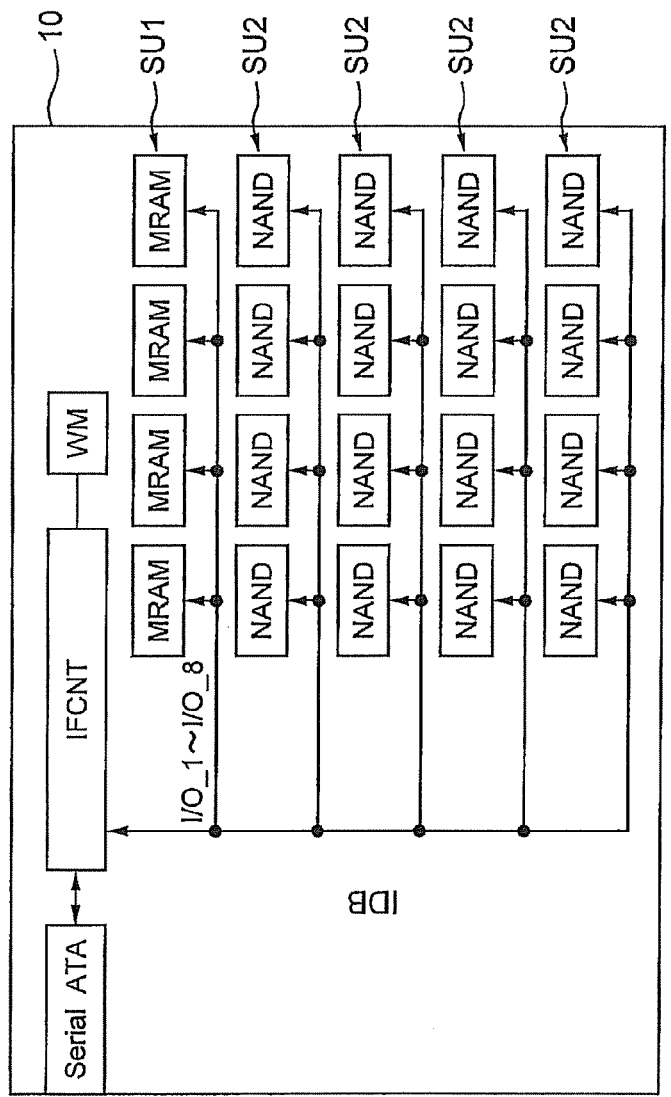
FIG. 12 is a block diagram showing the configuration of the storage system 10 according to the third embodiment.

FIG. 12 is a block diagram showing the configuration of the storage system 10 according to the third embodiment. An internal data bus IDB is shared between the first storage unit SU1 and the second storage units SU2. The first storage unit SU1 and the second storage units SU2 are commonly connected to the interface controller IFCNT via the internal data bus IDB.

The interface controller IFCNT is connected to a controller compliant with a serial ATA (Advanced Technology Attachment) standard.

The storage system 10 according to the third embodiment can function as an SSD (Solid State Drive) (a hybrid SSD) including both the MRAM and the NAND memories.

In the storage system 10 according to the third embodiment, many signal lines can be used commonly to the MRAM and the NAND memories. This can decrease the number of signal lines in the entire storage system 10 and facilitate designing the interface controller IFCNT.

The interface controller IFCNT stores therein the address conversion table 50. Therefore, in the third embodiment, similarly to the second embodiment, the interface controller IFCNT can change the physical addresses corresponding to the logical addresses in the address conversion table 50 between the physical addresses of the first storage unit SU1 and those of the second storage unit SU2, depending on the access frequency of the logical address. Therefore, in the third embodiment, it is possible to improve reliability of the overall storage system 10 by concentrating accesses on the MRAM having a higher rewritable count. Furthermore, it is possible to realize both an improvement in an access rate and a cost reduction by storing data having low access frequencies in the NAND memories.

Moreover, the first storage unit SU1 can be used as a buffer region for the second storage units SU2. For example, each NAND memory has a limited rewritable count and it is necessary to delete data in each block in the NAND memory. Small-capacity data can be, therefore, initially written to the MRAM of the first storage unit SU1. And, the small-capacity data is transferred from the first storage unit SU1 to one of the second storage units SU2 after data is accumulated in the first storage unit SU1 to some extent (by as much as a capacity equal to or larger than a capacity of one block in each NAND memory, for example). It is thereby possible to efficiently use the NAND memories.

(Modification)

In the second embodiment, each of the main controller MCNT and the sub-controllers SUBCNT1 to SUBCNT3 of the first to third storage units SU1 to SU3 can include a working memory WM. In the third embodiment, the interface controller IFCNT can include the working memory WM. The working memory WM is formed by using an MRAM and used as a cache memory when each of the controllers MCNT, SUBCNT1 to SUBCNT3, and IFCNT performs various operations. The working memory WM can be provided in at least one of the first sub-controller SUBCNT1, the second sub-controller SUBCNT2, the interface controller IFCNT, and the master controller MCNT.

Differently from storage memories, the working memory WM needs to be selected in light of the access rate rather than the cost and the storage capacity. A fast accessible MRAM is, therefore, suitable for the working memory WM. The MRAM used for the working memory WM can be configured differently from the MRAM used in the first storage unit SU1. Configurations of the MRAM of the working memory WM and those of the first storage unit SU1 are described later.

(Configuration of MRAM)

Figure 13:
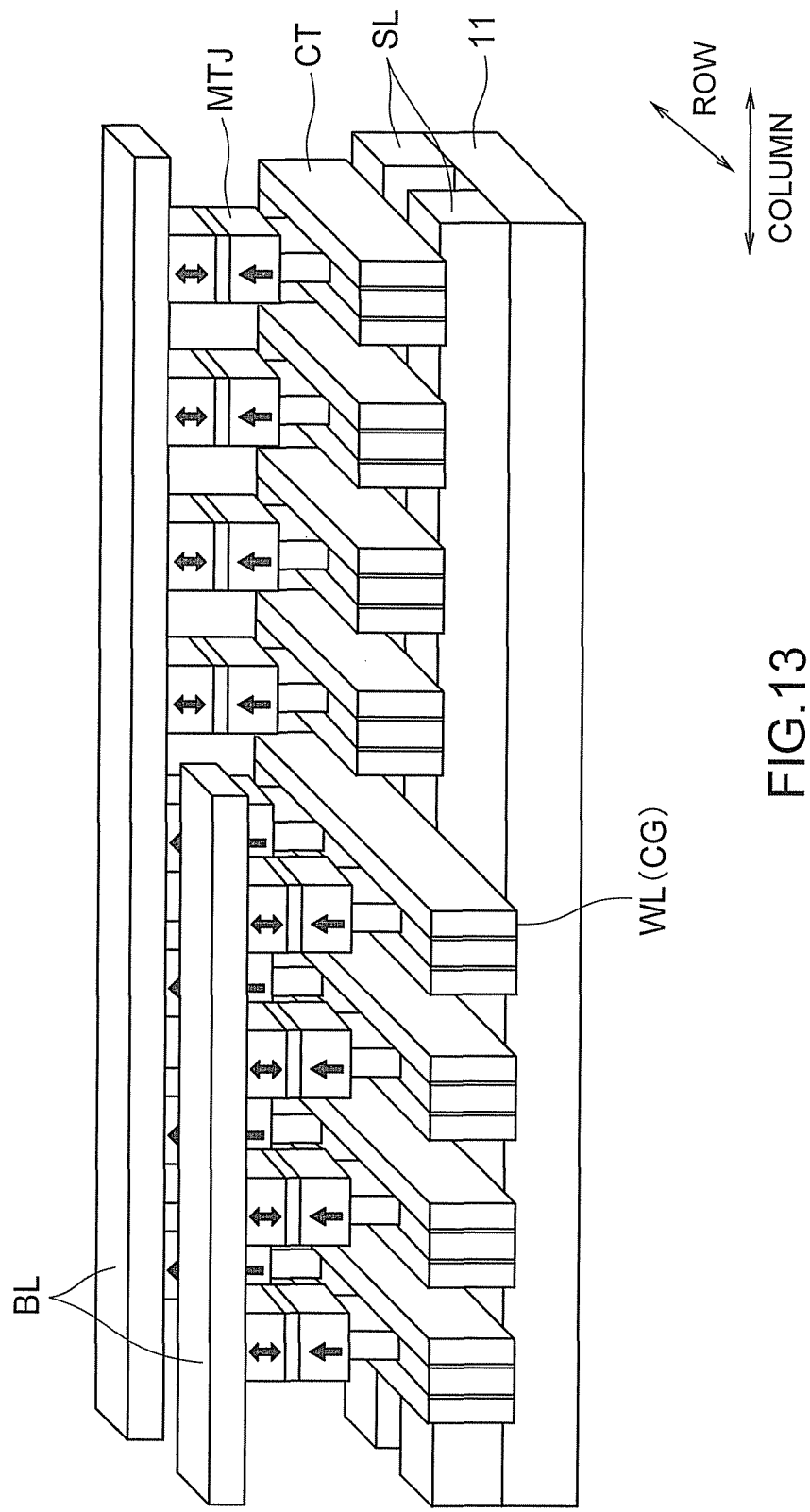
FIG. 13 is a perspective view showing the configuration of each MRAM used in the first storage unit SU1.

FIG. 13 is a perspective view showing the configuration of each MRAM used in the first storage unit SU1. Each MRAM according to the second and third embodiments includes a semiconductor substrate 11, cell transistors CT formed on the semiconductor substrate 11, and MTJ elements formed on the cell transistors CT, respectively. The semiconductor substrate 11 is, for example, a silicon substrate.

Each of the cell transistors CT is a vertical transistor a channel length direction of which is a perpendicular direction to a surface of the semiconductor substrate 11. Source lines SL, channel regions CH, and drain regions D of the cell transistors CT are stacked in the perpendicular direction to the surface of the semiconductor substrate 11. Furthermore, gate electrodes G are formed to surround the channel regions CH, respectively. That is, each of the cell transistors CT is formed using a so-called SGT (Surrounding Gate Transistor).

The MTJ elements are provided to correspond to the cell transistors CT, respectively, and stacked on the respective cell transistors CT in the perpendicular direction to the surface of the semiconductor substrate 11. Each of the MTJ elements is provided to overlap the corresponding cell transistor CT when being viewed from above the surface of the semiconductor substrate 11.

The source lines SL provided on the semiconductor substrate 11 extend in a column direction similarly to the bit lines BL. The source lines SL are connected to a source of each cell transistor CT or function as the source thereof. The word lines WL extend in a row direction orthogonal to the column direction. The word lines WL are connected to a gate electrode CG of each cell transistor CT or function as the gate electrode CG thereof. The bit lines BL are connected to an upper end of each of the MTJ elements and extend in the column direction. The bit lines BL are formed using, for example, tungsten. Pairs of the cell transistors CT and the MTJ elements are connected in series between the bit lines BL and the source lines SL.

Figure 14:
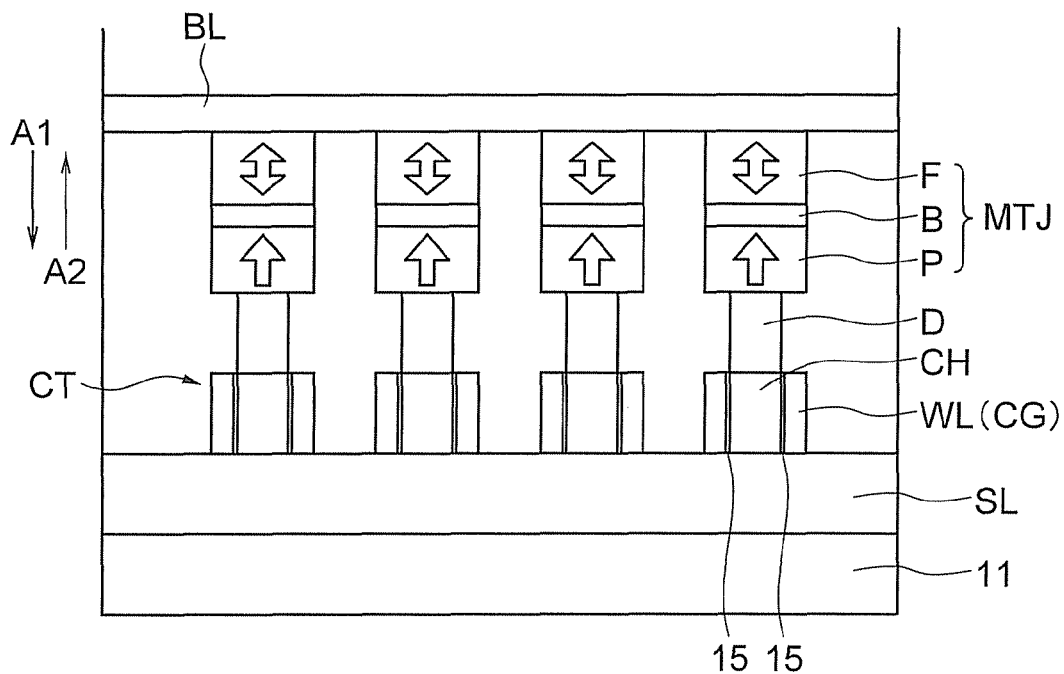
FIG. 14 is a cross-sectional view showing the configuration of the MRAM used in the storage systems 10 according to the second and third embodiments.

FIG. 14 is a cross-sectional view showing the configuration of the MRAM used in the storage systems 10 according to the second and third embodiments.

Each of the cell transistors CT includes the source line SL formed on the surface of the semiconductor substrate 11, the channel region CH provided on the source line SL, a gate dielectric film 15 formed around the channel region CH, the gate electrode CG formed on the gate dielectric film 15 to surround the channel region CH, and the drain region D provided on the channel region CH. The channel region CH is formed using, for example, columnar p-silicon. The source line SL and the drain region D are formed using, for example, n-silicon. The gate electrode CG is formed using, for example, polysilicon. The cell transistor CT is thereby formed as an n-SGT.

In the present embodiments, because the source lines SL are separated from one another to correspond to columns respectively, it is possible to reduce parasitic capacities of the source lines SL. This can accelerate the operation performed by the MRAM.

Each MTJ element is provided on one drain region D. A lower end of the MTJ element is electrically connected to the drain region D. The MTJ element includes a recording layer F, the pinned layer P, and a tunnel barrier layer B. A material of the pinned layer P and the recording layer F is a magnetic material containing, for example, Co, Fe, Ni, Pt, Fe, Pd, B, Ta, Dy, Tv, or Cr. The tunnel barrier layer B is formed using a nonmagnetic insulating film made of, for example, magnesium oxide or aluminum oxide. The tunnel barrier layer B is formed to be very thin so as not to impede the flow of a current between the recording layer F and the pinned layer P.

The STT-MTJ element stores therein digital data according to the change in the magnetic resistance due to a spin-polarized tunneling effect. The MTJ element can have a high resistance state or a low resistance state depending on a magnetization arrangement of the two ferromagnetic layers F and P. For example, the pinned layer P is a layer having a fixed magnetization direction, and the recording layer F is a layer having a variable magnetization direction. The STT-MTJ element stores data therein, depending on the magnetization directions of the pinned layer P and the recording layer F. For example, if it is defined that the low resistance state is data "0" and that the high resistance state is data "1", one-bit data can be recorded in the MTJ element. Needless to say, it can be defined that the low resistance state is the data "1" and that the high resistance state is the data "0".

Arrows indicated within the MTJ elements shown in FIGS. 13 and 14 indicate the magnetization directions of the respective ferromagnetic bodies. That is, the magnetization directions of the pinned layer P and the recording layer F of each of the MTJ elements according to the present embodiments are perpendicular to the surface of the semiconductor substrate 11. Such perpendicular MTJ elements can be arranged with a higher density than in-plane MTJ elements.

When a current equal to or higher than an inversion threshold electrode flows in an arrow A1 direction during the write operation, the magnetization direction of the free layer F becomes parallel (a P state) to that of the pinned layer P, and the MTJ element is made into a low resistance state (data "0"). When a current equal to or higher than the inversion threshold electrode flows in an arrow A2 direction during the write operation, the magnetization direction of the free layer F becomes anti-parallel (an AP state) to that of the pinned layer P, and the MTJ element is made into a high resistance state (data "1"). In this way, different data can be written to the MTJ element, depending on the current direction. A positional relation between the pinned layer P and the free layer F can be set opposite to that described above.

The MRAM according to the present embodiments includes the SGT and the perpendicular MTJ elements stacked in the perpendicular direction to the surface of the semiconductor substrate 11. It is, therefore, possible to realize an MRAM having a small layout area and a high density. The layout area of a single cell unit of the MRAM shown in FIGS. 13 and 14 is, for example, $4F^2$. F (Feature Size) indicates a minimal line width at which the cell unit can be formed in a semiconductor manufacturing process.

Figure 15:
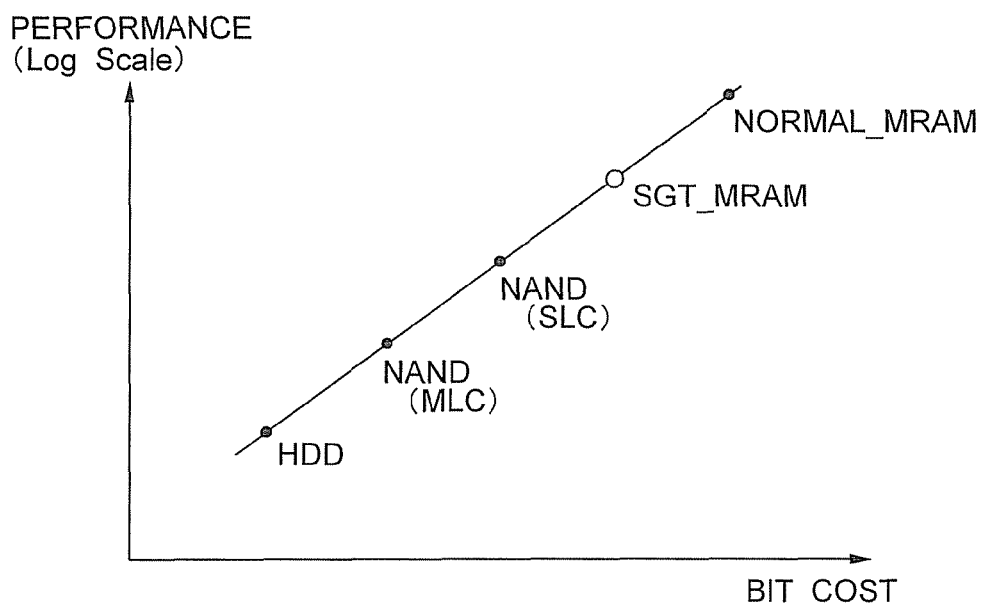
FIG. 15 is a graph showing comparison among the HDD, the NAND, and the MRAM in a performance and a bit cost.

FIG. 15 is a graph showing comparison among the HDD, the NAND, and the MRAM in a performance and a bit cost. In FIG. 15, a NAND (SLC (Single Level Cell)) is a NAND memory storing one-bit data in one cell. A NAND (MLC (Multi Level Cell)) is a NAND memory storing a plurality of pieces of bit data in one cell.

As shown in FIG. 15, the MRAM including the SGT as the cell transistors CT (hereinafter, "SGT-MRAM") is inferior to the MRAM including plane transistors as the cell transistors CT (hereinafter, "NORMAL-MRAM") in an access rate (performance). However, the SGT-MRAM is smaller than the NORMAL-MRAM in a layout area. For this reason, the SGT-MRAM is lower than the NORMAL-MRAM in a bit cost. On the other hand, in comparison with NAND memory, the SGT-MRAM is higher than the NAND memory in a bit cost but higher in an access rate (performance).

The SGT-MRAM has the performance and the bit cost both of which are intermediate between those of the NAND memory and the NORMAL-MRAM. Therefore, it can be said that the SGT-MRAM is suited to construct a storage system having a high performance to some extent at a low cost to some extent.

That is, the SGT-MRAM is suited to be used as a storage manufactured at a lower cost to some extent and required to have a higher access rate to some extent than the working memory WM manufactured at a high cost but required to have a quite high access rate. On the other hand, it can be said that the NORMAL-MRAM is suited to be used as a working memory WM having a high bit cost but required to have a high access rate. The storage system 10 according to the present embodiments uses the SGT-MRAM as the third storage units SU3 and the NORMAL-MRAM as the working memories WM. It is, therefore, possible to improve the balance among the storage capacity, the access rate, and the cost.

(Fourth Embodiment)

Figure 16:
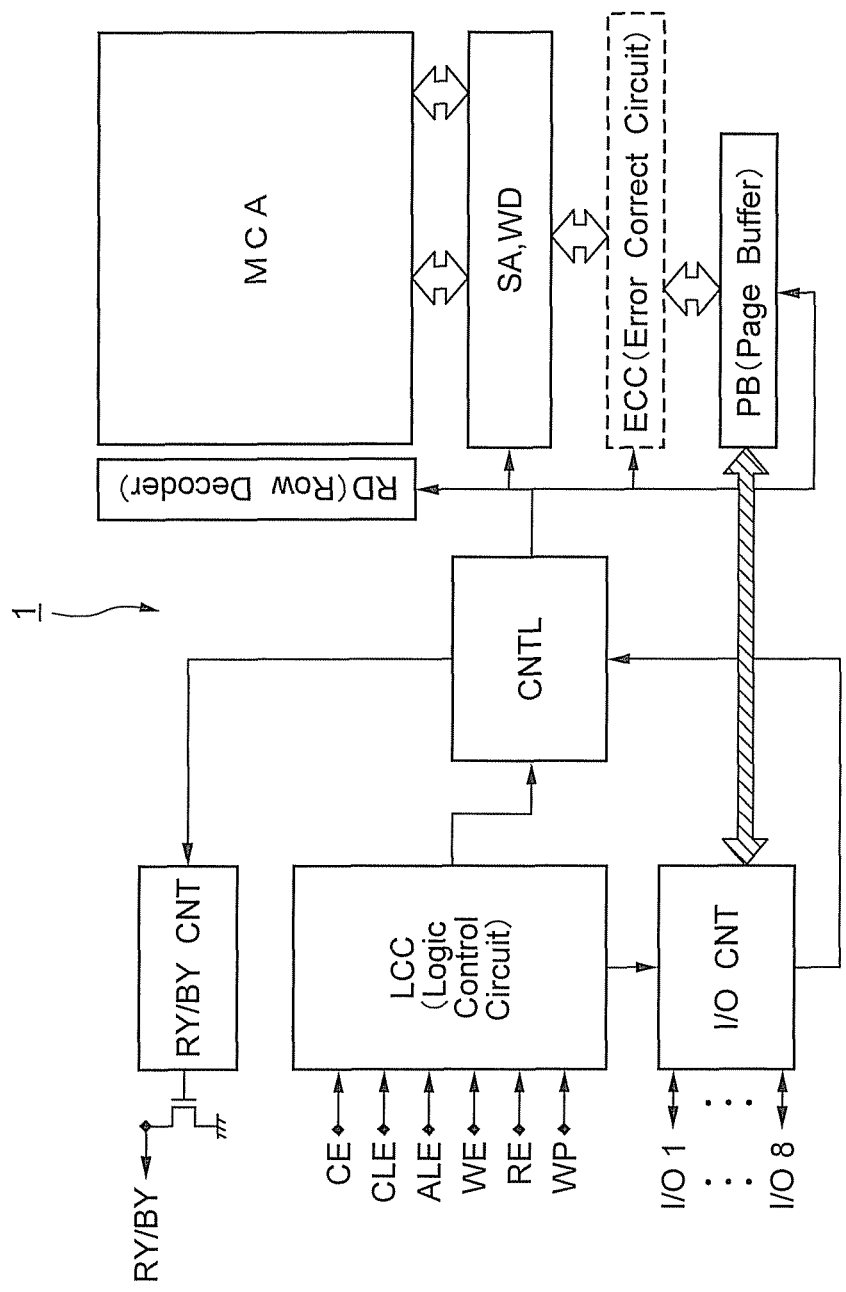
FIG. 16 is a block diagram showing an internal configuration of a certain memory chip 1 in the storage unit SU1 according to a fourth embodiment.

FIG. 16 is a block diagram showing an internal configuration of a certain memory chip 1 (an MRAM chip, for example) in the storage unit SU1 according to a fourth embodiment. The storage unit SU1 is, for example, the storage unit SU1 shown in FIG. 11. Furthermore, the internal configuration of the memory chip 1 shown in FIG. 16 is basically similar to that of the memory chip 1 shown in FIG. 1 except for division of the respective circuits.

For example, the clock buffer CLKB, the command controller CMDC, and the address controller ADDC shown in FIG. 1 can be provided in a logic control circuit LCC shown in FIG. 16. The column controller CC, the row controller RC, and the main data controller MDC shown in FIG. 1 can be provided in a controller CNTL shown in FIG. 16.

A ready/busy signal controller RY/BYCNT shown in FIG. 16 is not shown in FIG. 1. The ready/busy signal controller RY/BYCNT outputs a ready signal RY or a busy signal BY via an RY/BY pin. The ready signal RY and the busy signal BY are signals complementary to each other in logic. When one of the ready signal RY and the busy signal BY is active (valid), the other signal is inactive (invalid). Therefore, the ready/busy signal controller RY/BYCNT suffices to output one of the ready signal RY and the busy signal BY. It is assumed herein that the ready/busy signal controller RY/BYCNT outputs the busy signal BY. Needless to say, the ready/busy signal controller RY/BYCNT can output the ready signal RY complementary to the busy signal BY in logic instead of the busy signal BY. Alternatively, the ready/busy signal controller RY/BYCNT can output both the busy signal BY and the ready signal RY.

The ready/busy signal controller RY/BYCNT activates the busy signal BY (or deactivates the ready signal RY) so as to reject reception of the read enable signal RE or the write enable signal WE. Conversely, the ready/busy signal controller RY/BYCNT deactivates the busy signal BY (or activates the ready signal RY) so as to permit the reception of the read enable signal RE or the write enable signal WE. The memory chip 1 can reject the reception of the other signals such as the command latch enable signal CLE and the address latch enable signal ALE according to the activation of the busy signal BY (or deactivation of the ready signal RY).

The chip enable signal CE is a signal that enables the memory chip 1 to be driven. The command latch enable signal CLE and the address latch enable signal ALE are signals that permit latching of an input command and latching of an input address, respectively. The read enable signal RE is a signal that enables data to be read from the memory chip 1. The write enable signal WE is a signal that enables data to be written to the memory chip 1. The write protect signal WP is a signal that protects data in the memory chip 1. The chip enable signal CE, the command latch enable signal CLE, the address latch enable signal ALE, the read enable signal RE, the write enable signal WE, and the write protect signal WP can be input from the individual pins. For example, those pins are arranged on the logic control circuit LCC. An input/output controller I/OCNT includes the input/output signal pins I/O1 to I/O8. The ready/busy signal controller RY/BYCNT includes an output pin from which the ready signal RY or the busy signal BY is output.

The controller CNTL controls the respective constituent elements shown in FIG. 16 during the data read operation and the data write operation. The controller CNTL is connected to the input/output controller I/OCNT, the logic control circuit LCC, and the ready/busy signal controller RY/BYCNT. The controller CNTL determines how the respective constituent elements operate in response to the commands or addresses received from the input/output controller I/OCNT and the logic control circuit LCC. The controller CNTL also determines how the ready/busy signal controller RY/BYCNT operates.

An error correct circuit ECC shown in FIG. 16 calculates parity information based on the write data during the write operation. The parity information is stored in a part of the memory cell array MCA so as to correct an error in the read data. Furthermore, the error correct circuit ECC corrects the error included in the read data based on the parity information during the read operation. The error correct circuit ECC can be provided within the memory chip 1 or in an external controller (the interface controller IFCNT or the master controller MCNT, for example) outside of the memory chip 1.

If the error correct circuit ECC is provided within the memory chip 1, a memory region for storing the parity information is set in advance. That is, in this case, a normal array for storing normal data and a parity array for storing the parity information are separated in advance in the memory chip 1. On the other hand, if the error correct circuit ECC is provided outside of the memory chip 1, a user arbitrarily sets a memory region for storing the parity information in the external controller. It is, therefore, unnecessary to separate the normal array from the parity array in the memory chip 1.

The memory chip 1 also includes the memory cell arrays MCA, the sense amplifiers SA, the write drivers WD, a row decoder RD, and the like. The row decoder RD selects one word line WL according to an address. The sense amplifiers SA can detect data by the self-referencing method according to the first embodiment. Furthermore, the memory chip 1 according to the fourth embodiment can be applied to the storage unit SU1 according to the second embodiment and/or the third embodiment.

(Read Operation)

Figure 17:
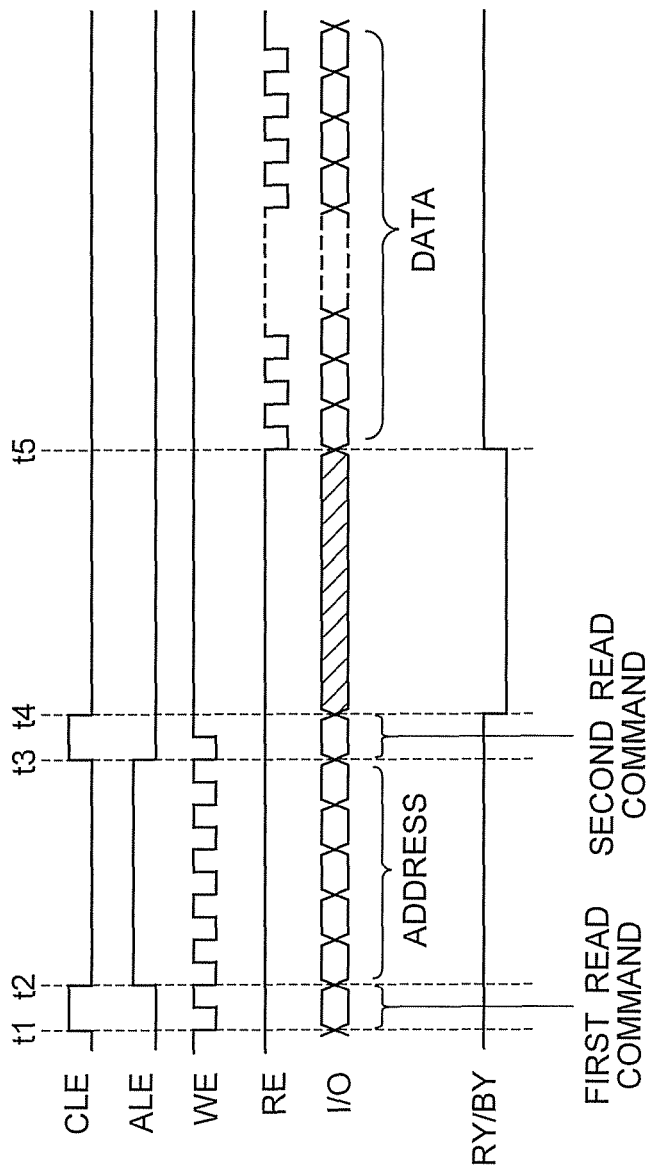
FIG. 17 is a timing diagram showing the data read operation performed by the memory chip 1 according to the fourth embodiment.
Figure 18:
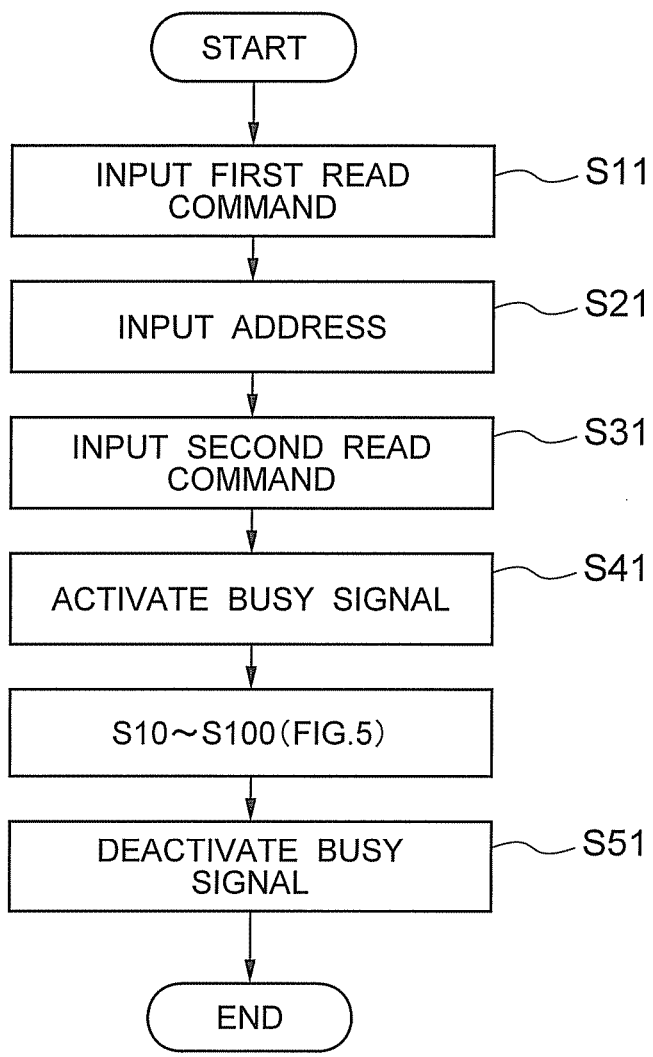
FIG. 18 is a flowchart showing the data read operation performed by the memory chip 1 according to the fourth embodiment.

FIG. 17 is a timing diagram showing the data read operation performed by the memory chip 1 (the MRAM chip) according to the fourth embodiment. FIG. 18 is a flowchart showing the data read operation performed by the memory chip according to the fourth embodiment. The data read operation performed by the memory chip 1 is described with reference to FIGS. 17 and 18. The memory chip 1 according to the fourth embodiment receives commands based on the standard of the NAND flash memory and operates in response to the commands. In the data read operation, therefore, the memory chip 1 starts the data read operation by receiving two read commands.

Initially, the ready/busy signal controller RY/BYCNT has deactivated the busy signal BY, and the memory chip 1 is in a state of being able to receive a read command or a write command.

In a period from t1 to t2, when the command latch enable signal CLE rises and the write enable signal WE falls, the memory chip 1 receives a first read command from the external controller (the interface controller IFCNT shown in FIG. 11, for example) (S11 in FIG. 18).

In a period from t2 to t3, when the address latch enable signal ALE rises, the memory chip 1 continuously receives addresses of read target data from the external controller whenever the write enable signal WE falls (S21 in FIG. 18).

In a period from t3 to t4, when the command latch enable signal CLE rises again and the write enable signal WE falls, the memory chip 1 receives a second read command from the external controller (S31 in FIG. 18). The memory chip 1 thereby starts the data read operation. That is, by receiving the second read command after receiving the first read command, the memory chip 1 starts the data read operation for reading data from the memory cell array MCA to the page buffer PB.

At the time t4, when the second read command is input, the ready/busy signal controller RY/BYCNT outputs the busy signal BY. In this case, the ready/busy signal controller RY/BYCNT activates the busy signal BY to logical low (S41 in FIG. 18). The memory chip 1 thereby transitions into a busy state and rejects the reception of signals such as a read command and a write command.

In a period during which the memory chip 1 is in the busy state, the read target data is read from the memory cell array MCA to the page buffer PB. The data read operation at this time is performed using the self-referencing method according to the first embodiment.

In the data read operation, the memory chip 1 reads the read target data according to the addresses received at Step S21. At the time of reading the read target data, the memory chip 1 also reads the parity information for error correction. These read target data and parity information are temporarily stored in the page buffer PB. The memory chip 1 performs reading of the read target data and the parity information according to the self-referencing method (Steps S10 to S100) shown in FIG. 5. At the time of detecting the data at Step S90 in FIG. 5, the error correct circuit ECC corrects errors included in the read target data based on the parity information.

The error-corrected data is restored in the memory cell array MCA as shown at Step S100 in FIG. 5. The error-corrected data is the data restored to correct data originally stored in the memory cell array MCA. That is, the restoring operation shown at Step S100 in FIG. 5 can be paraphrased into a restoration write operation.

At a time t5, after all the read target data is read to the page buffer PB and the errors included in the read target data are corrected, the ready/busy signal controller RY/BYCNT deactivates the busy signal BY to logical high (S51 in FIG. 18). At a falling timing of the read enable signal RE, the memory chip 1 outputs the read target data to the outside from the I/O pin. When the read enable signal RE continuously falls, the memory chip 1 continuously outputs the read target data from the I/O pin at each falling timing.

In this way, the memory chip 1 can output the error-corrected read target data stored in the page buffer PB to the outside. Furthermore, the memory chip 1 turns into a state (a ready state) of being able to receive a read command or a write command.

The memory chip 1 according to the fourth embodiment activates the busy signal BY during the period of the data read operation for reading the data from the memory cell array MCA to the page buffer PB and the period of the restoring operation for restoring the data from the page buffer PB to the memory cell array MCA shown in FIG. 5. The memory chip 1 thereby rejects the reception of signals from the outside. The memory chip 1 can, therefore, complete the read operation and the restoring operation without disturbance from the other signals.

The timing of deactivating the busy signal BY is the same as the timing at which the signal W0 falls during the restoring operations (t6 to t7) shown in FIG. 4.

(Write Operation)

Figure 19:
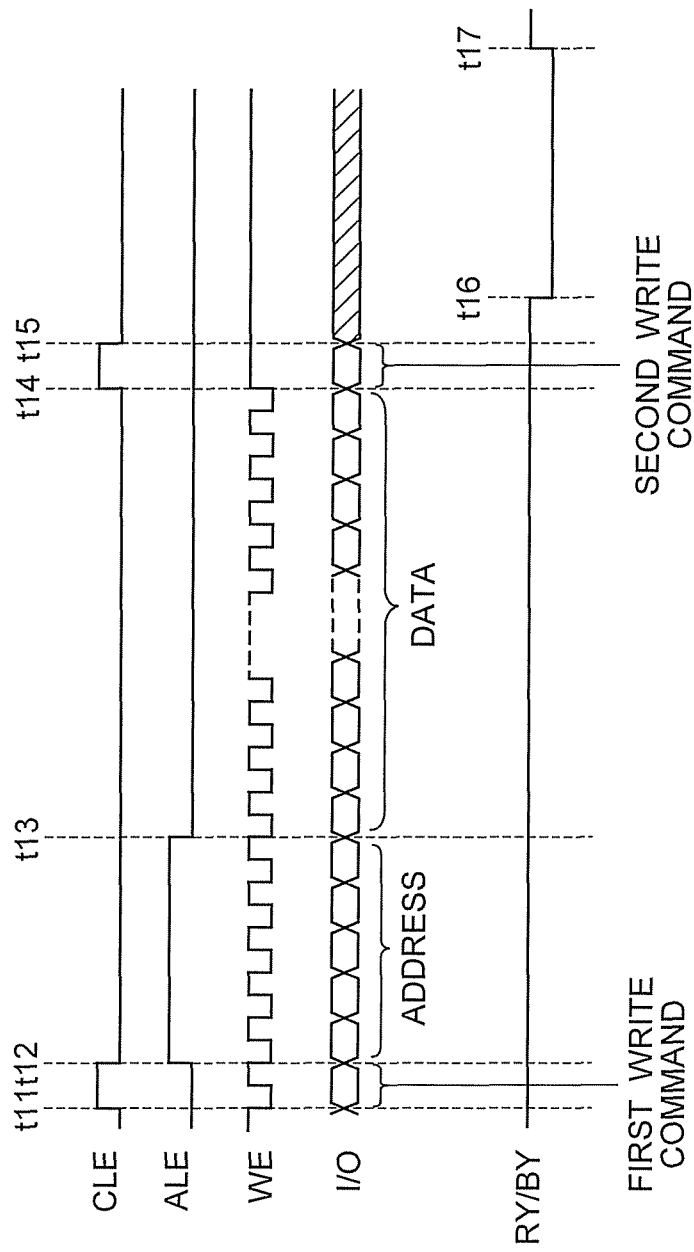
FIG. 19 is a timing diagram showing the data write operation performed by the memory chip 1.
Figure 20:
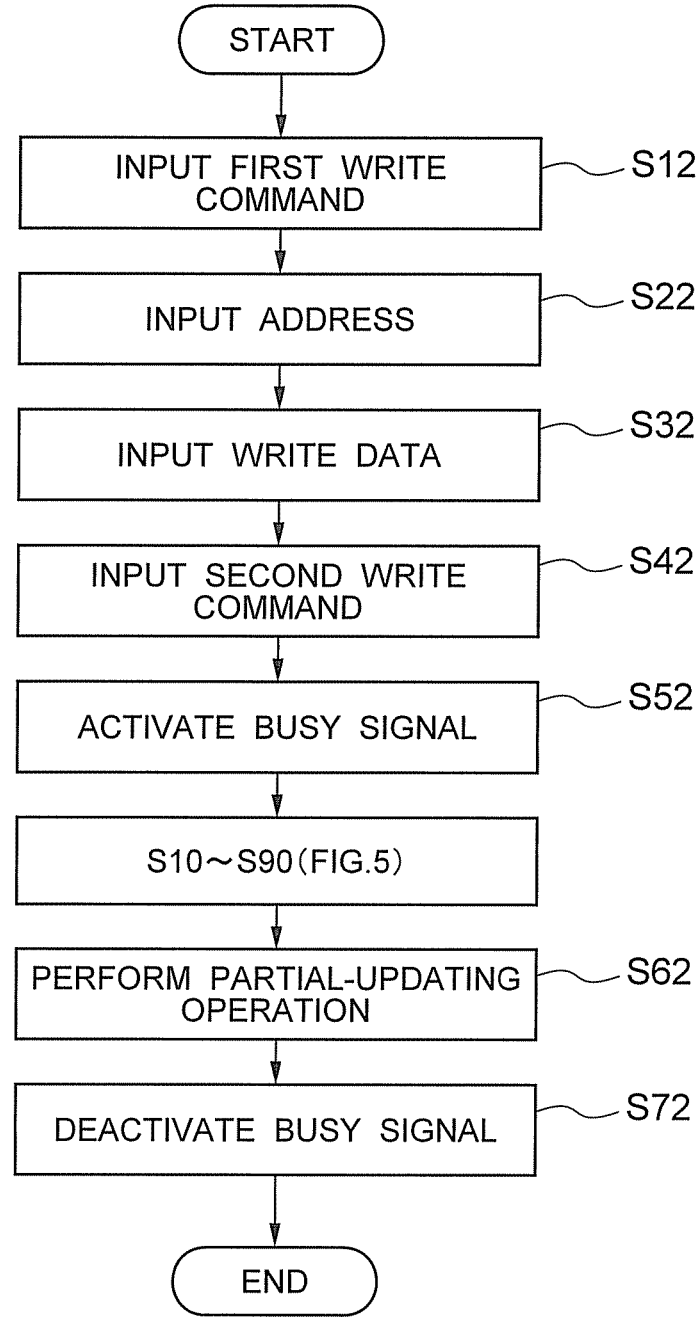
FIG. 20 is a flowchart showing the data write operation performed by the memory chip 1 according to the fourth embodiment.

FIG. 19 is a timing diagram showing the data write operation performed by the memory chip 1 (an MRAM chip). FIG. 20 is a flowchart showing the data write operation performed by the memory chip 1 according to the fourth embodiment. The data write operation performed by the memory chip 1 is described with reference to FIGS. 19 and 20. The following write operation is an RMW (Read Modify Write) operation. The RMW operation is the write operation performed in a case that the error correct circuit ECC is provided within the memory chip 1. If the error correct circuit ECC is provided outside of the memory chip 1, the memory chip 1 performs the write operation according to a setting by a user. Moreover, based on the standard of the NAND flash memory, the memory chip 1 performs the data write operation in response to two write commands.

Initially, the ready/busy signal controller RY/BYCNT has deactivated the busy signal BY. The memory chip 1 is in a state of being able to receive a read command or a write command.

In a period from t11 to t12, when the command latch enable signal CLE rises and the write enable signal WE falls, the memory chip 1 receives a first write command from the external controller (the interface controller IFCNT shown in FIG. 11, for example) (S12 in FIG. 20).

Next, in a period from t12 to t13, when the address latch enable signal ALE rises, the memory chip 1 receives an address of a write target page from the external controller at each time when the write enable signal WE falls (S22 in FIG. 20).

At the time t13, after the address latch enable signal ALE falls, the write target data is input from the external controller to the memory chip 1 via the I/O pin (S32 in FIG. 20).

In a period from t13 to t14, when the write enable signal WE continuously falls, the write target data is continuously input from the I/O pin in an order of addresses at each falling timing. The write target data is temporarily stored in the page buffer PB.

In a period from t14 to t15, when the command latch enable signal CLE rises again and the write enable signal WE falls, the memory chip 1 receives a second write command from the external controller (S42 in FIG. 20). By receiving the second write command, the memory chip 1 starts the data write operation.

Right after the time t15, in a period from t16 to t17, the ready/busy signal controller RY/BYCNT activates the busy signal BY (S52 in FIG. 20). The memory chip 1 thereby rejects the reception of signals such as a read command and a write command.

In the data write operation, the memory chip 1 temporarily reads the data from the page specified by the addresses received at Step S22. At a time of reading the data, the memory chip 1 also reads the parity information for error correction. The memory chip 1 performs the reading of the data and the parity information according to the self-referencing method (Steps S10 to S90) shown in FIG. 5. At the time of detecting the data at Step S90 shown in FIG. 5, the error correct circuit ECC corrects errors included in the read target data based on the parity information.

The data that is read from the memory cell array MCA and that is error-corrected is stored in the page buffer PB. However, if the write target data is in units of pages, the data read from the memory cell array MCA is not actually stored in the page buffer PB. On the other hand, if the write target data includes a part smaller than one page, an insufficient part of the page is complemented with the data read from the memory cell array MCA. For example, if the write target data is only a half of one page, data on the insufficient part of the page (data on the half page) is complemented with the data read from the memory cell array MCA. The write target data and the data used for the complementation (hereinafter, "complementary data") form one page. Thus, the write target data and the complementary data are stored in the page buffer PB.

The reason for complementing the write target data smaller than one page with the data from within the memory cell array MCA is as follows. The error correct circuit ECC creates parity information per page for the data stored in the page buffer PB. Because the parity information is calculated in units of pages, when the write target data includes the part smaller than one page, it is necessary to complement the insufficient part of the page with the data read from the memory cell array MCA. The write target data and the complementary data form one page, whereby the write target data as well as the parity information can be written to the memory cell array MCA. The write target data is written to a normal array of the memory cell array MCA whereas the parity information is written to a parity array of the memory cell array MCA. In this way, in the RMW operation, the memory chip 1 complements the write target data smaller than one page with the data in the memory cell array MCA for calculating the parity information.

When the write target data is input in units of pages, there is no need to store the data read from the memory cell array MCA in the page buffer PB as described above. In this case, the sense amplifier SA can perform a read operation itself so that timing of the write operation can match the timing of the write operation in a case where the write target data is smaller than one page. Alternatively, it suffices that the sense amplifier SA does not perform the read operation itself so as to omit unnecessary operations.

When the error correct circuit ECC is provided outside of the memory chip 1, the error correct circuit ECC creates the parity information according to a setting by a user. For example, when the write target data is data on the half page, the external controller reads data on the half page from the memory chip 1 according to the user's setting. The external error correct circuit ECC complements the write target data with the read data to form one page, and calculates the parity information on the page. The parity information as well as the write target data and the complementary data are written to the memory chip 1. At this time, the external controller sets an address of the parity information.

In the MRAM, the data in the memory cell array MCA is not lost only by driving the word line WL. Therefore, the memory chip 1 can read only the data on the half page. In the fourth embodiment, the read operation or the write operation is performed for each page so that the memory chip 1 can comply with the standard of the NAND flash memory and obtain the parity information.

Next, the write target data and/or the complementary data stored in the page buffer PB is restored to the memory cell array MCA (S62 in FIG. 20). The write target data is newly updated data. The complementary data is the data that has been read from the memory cell array MCA and that has been error-corrected. The restoring operation at Step S62 can be paraphrased into a partial-updating restoration write operation (hereinafter, partial-updating operation).

After the partial-updating operation is finished, at a time t17, the ready/busy signal controller RY/BYCNT deactivates the busy signal BY (S72). The data write operation thereby ends, and the memory chip 1 turns into a state of being able to receive a read command or a write command.

In this way, the memory chip 1 according to the fourth embodiment activates the busy signal BY during the read operation shown in FIG. 5 and during the partial updating operation (S62) shown in FIG. 20. The memory chip 1 thereby rejects the reception of the signals from the outside, so that the memory chip 1 can complete the read operation and the partial updating operation without disturbance from the other signals.

Figure 21:
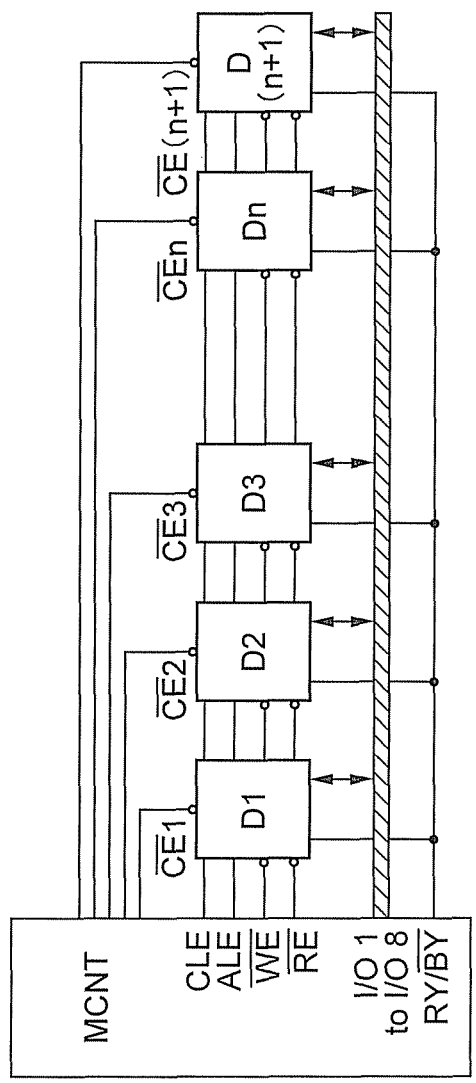
FIG. 21 shows a storage system in which a plurality of memory chips D1 to D(n+1) are connected to a common master controller MCNT.

FIG. 21 shows a storage system in which a plurality of memory chips D1 to D(n+1) (n is an integer) according to the fourth embodiment are connected to a common master controller MCNT. The master controller MCNT can be configured similarly to the master controller MCNT shown in FIG. 9 or the interface controller IFCNT shown in FIG. 11. Each of the memory chips D1 to D(n+1) is the memory chip 1 (the MRAM) or the NAND flash memory according to the fourth embodiment.

The memory chips D1 to D(n+1) share the master controller MCNT and the signals CLE, ALE, WE, RE, I/O1 to I/O8, and RY/BY. This can reduce a mounting area of the master controller MCNT and decrease the number of wirings for transmitting signals.

The wirings for transmitting the chip enable signals CE1 bar to CE(n+1) bar are divided to correspond to the memory chips D1 to D(n+1), respectively. Therefore, the master controller MCNT can issue different commands to the memory chips D1 to D(n+1), respectively. The master controller MCNT can, thereby, control the memory chips D1 to D(n+1) to operate individually. Therefore, in the storage system shown in FIG. 21, the memory chips D1 to D(n+1) can apparently operate as one large-capacity memory.

Furthermore, the storage system according to the fourth embodiment rejects the reception of signals such as the other read command or write command while one of the memory chips D1 to D(n+1) is activating the busy signal BY. It is thereby possible to suppress destruction of the data by external commands, when the sense amplifier SA is reading the data from the memory cell array MCA or the write driver WD is writing data to the memory cell array MCA in one of the memory chips D1 to D(n+1).

Moreover, the read operation based on the self-referencing method needs longer time than that of a general read operation of an MRAM or a DRAM. However, by outputting the busy signal BY and/or the ready signal RY to the master controller MCNT, it is possible to make an input timing of the next command appropriate. For example, the master controller MCNT can determine whether commands can be input to the memory chips D1 to D(n+1) from the busy signal BY. Therefore, it suffices that the master controller MCNT transmits commands right after the busy signal BY is deactivated. This makes it unnecessary for the master controller MCNT to excessively await the output of the next command. That is, the memory system according to the fourth embodiment can prevent extension of a command waiting time.

Furthermore, in the fourth embodiment, each of the memory chips D1 to D(n+1) complies with the standard of the NAND flash memory. Therefore a mixture of the MRAM chips and the NAND flash memory chips can be mounted on the memory system shown in FIG. 21. The master controller MCNT can be configured similarly to a controller of the NAND flash memory. Therefore, the MRAM chips according to the fourth embodiment can be used as general-purpose chips without distinction from the NAND flash memory chips.

(Fifth Embodiment)

FIG. 22 is a layout view of the memory chip 1 according to a fifth embodiment. The memory chip 1 can be configured similarly to the memory chip 1 (the MRAM) according to the preceding embodiments.

The memory chip 1 includes four memory cell arrays MCA (cell planes), the row decoders RD, the write drivers WD, the sense amplifiers SA, the page buffers PB, current sinks CS, peripheral circuits PERI, and pads PD. The number of memory cell arrays MCA is not limited to four.

The row decoders RD are provided on two opposing sides among four sides of each memory cell array MCA, respectively, and selectively drive one word line WL. One of the write drivers WD, one of the sense amplifiers SA, and one of the page buffers PB are provided on one of the other sides of each memory cell array MCA. The write driver WD and the sense amplifier SA are connected to a global bit line GBL shown in FIG. 23 and transfer a current to the memory cell MC via the global bit line GBL. The write driver WD carries the current to the memory cell MC via the global bit line GBL and writes data to the memory cell MC. The sense amplifier SA carries the current to the memory cell MC via the global bit line GBL and reads data from the memory cell MC. The page buffer PB temporarily stores therein the write target data captured from the outside or the read target data read from the memory cell array MCA.

Figure 23:
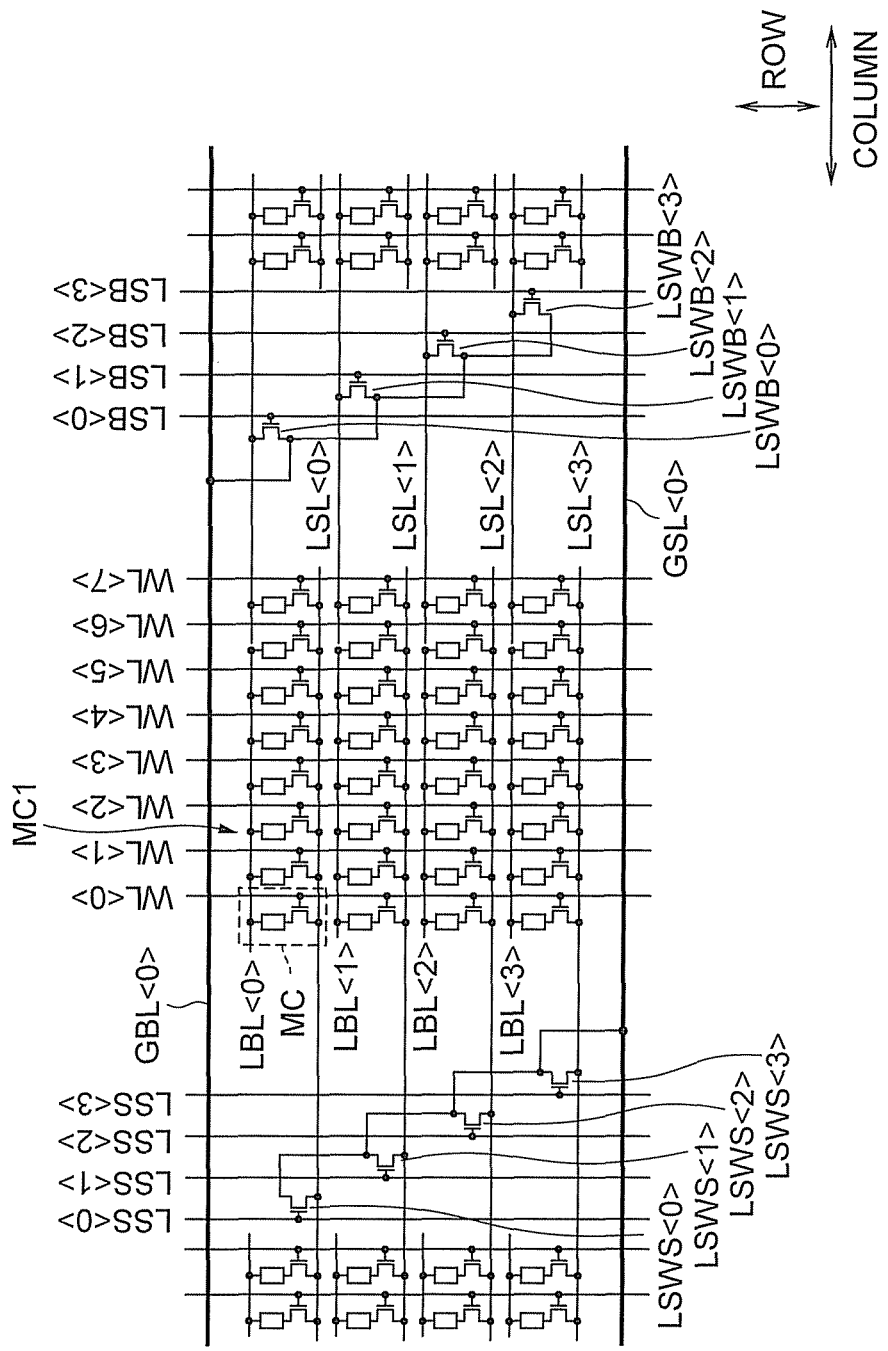
FIG. 23 is an equivalent circuit diagram showing a configuration of each of the memory cell arrays MCA according to the fifth embodiment.

One of the current sinks CS is provided on the remaining one side of each memory cell array MCA and connected to a global source line GSL shown in FIG. 23. The current sink CS absorbs the current flowing in the memory cell MC during the data write operation or data read operation via the global source line GSL.

The peripheral circuits PERI are connected between the page buffers PB of the respective memory cell arrays MCA and the pad PD.

In this way, the both sides of each memory cell array MCA in the memory chip 1 according to the fifth embodiment face the row decoders RD, respectively. The upper side of the memory cell array MCA in FIG. 22 faces the current sink CS. The lower side of the memory cell array MCA in FIG. 22 faces the write driver WD, the sense amplifier SA, the page buffer PB, and the peripheral circuits PERI.

FIG. 23 is an equivalent circuit diagram showing a configuration of each of the memory cell arrays MCA according to the fifth embodiment. In the memory cell array MCA, the memory cells MC are arranged two-dimensionally in a matrix. A plurality of local bit lines LBL<0> to LBL<3> and a plurality of local source lines LSL<0> to LSL<3> extend in a column direction. A plurality of word lines WL<0> to WL<7> extend in a row direction. The local bit lines LBL<0> to LBL<3> are connected to one end of each memory cell MC, and the local source lines LSL<0> to LSL<3> are connected to the other end of each memory cell MC.

Furthermore, the local bit lines LBL<0> to LBL<3> are commonly connected to the global bit line GBL<0> via local switches LSWB<0> to LSWB<3>, respectively. That is, the local switches LSWB<0> to LSWB<3> are connected between the local bit lines LBL<0> to LBL<3> and the global bit line GBL<0>, respectively. Gates of the local switches LSWB<0> to LSWB<3> are connected to local switch lines LSB<0> to LSB<3> and controlled to be turned on or off by signals from the local switch lines LSB<0> to LSB<3>, respectively. The local source lines LSL<0> to LSL<3> are commonly connected to the global source line GSL<0> via local switches LSWS<0> to LSWS<3>, respectively. That is, the local switches LSWS<0> to LSWS<3> are connected between the local source lines LSL<0> to LSL<3> and the global source line GSL<0>, respectively. Gates of the local switches LSWS<0> to LSWS<3> are connected to local switch lines LSS<0> to LSS<3> and controlled to be turned on or off by signals from the local switch lines LSS<0> to LSS<3>, respectively.

The memory chip 1 configured as described above can selectively connect a certain memory cell MC between the global bit line GBL and the global source line GSL by selecting one word line WL, one local switch line LSB, and one local switch line LSS. For example, when the word line WL<2> and the local switch lines LSB<0> and LSS<0> are selected, the memory cell MC1 shown in FIG. 23 is selectively connected between the global bit line GBL and the global source line GSL. The write driver WD can thereby write data to the memory cell MC1 or the sense amplifier SA can read data from the memory cell MC1.

In the write operation of writing the data "0", a current flows to the current sink CS via the write driver WD, the global bit line GBL, the local bit line LBL, the memory cell MC, the local source line LSL, and the global source line GSL. In the write operation of writing the data "1", the current flows to the current sink CS conversely via the write driver WD, the global source line GSL, the local source line LSL, the memory cell MC, the local bit line LBL, and the global bit line GBL.

In the data read operation, the current flows to the current sink CS via the sense amplifier SA, the global bit line GBL, the local bit line LBL, the memory cell MC, the local source line LSL, and the global source line GSL.

The number of the sense amplifiers SA or the write drivers WD is the same as the number of pairs of global bit lines GBL and global source lines GSL. The write operation or read operation is thereby performed simultaneously to a plurality of memory cells MC. Alternatively, the number of the sense amplifiers SA or the write drivers WD is not necessarily the same as the number of pairs of global bit lines GBL and global source lines GSL, but can be provided with respect to a plurality of pairs of global bit lines GBL and global source lines GSL.

The memory cells MC are configured as described above with reference to FIGS. 13 and 14. Each of the memory cells MC includes the vertical SGT and the MTJ element arranged on the vertical SGT.

FIGS. 24A to 24D are cross-sectional views showing structures of one memory cell MC, one local switch LSWB or LSWS, a short-circuit element SE, and an open element OE, respectively. The memory cells MC, the local switches LSWB and LSWS, the short-circuit elements SE, and the open elements OE are formed on a common P-semiconductor substrate 11 and formed based on a pillar structure of the vertical SGT.

Figure 24:
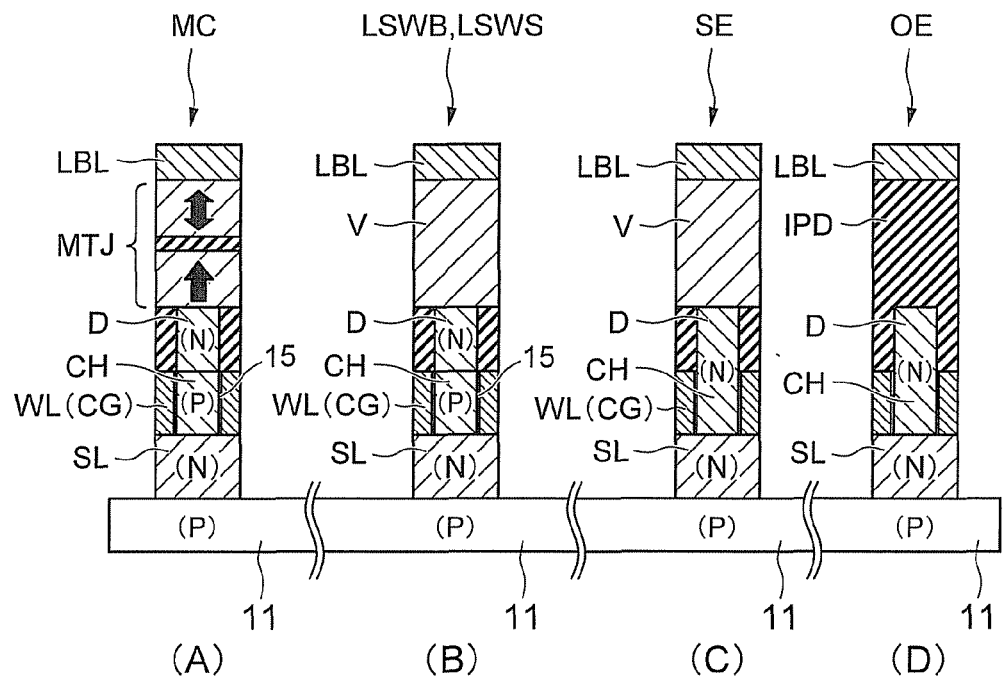
FIGS. 24A to 24D are cross-sectional views showing structures of one memory cell MC, one local switch LSWB or LSWS, a short-circuit element SE, and an open element OE, respectively.

Because the memory cell MC shown in FIG. 24A is similar to the memory cells MC shown in FIG. 14 in structure, detailed explanations thereof will be omitted.

The local switch LSWB or LSWS shown in FIG. 24B includes a pillar structure of the vertical SGT. A conductive via V is provided on the vertical SGT. The via V electrically connects the drain layer D to the local bit line LBL.

The short-circuit element SE shown in FIG. 24C is configured similarly to the local switch LSWB or LSWS except that the channel region CH in the pillar structure of the local switch LSWB or LSWS is formed to have the same conduction type as that of the drain layer D and the source layer SL. The local bit line LBL thereby electrically short-circuits the via V, the drain layer D, the channel region CH, and the source layer SL to one another.

The open element OE shown in FIG. 24D is configured similarly to the pillar structure of the short-circuit element SE except that an interlayer dielectric film ILD having an electrical insulating property is provided in place of the via V. The local bit line LBL is thereby electrically insulated from the drain layer D, the channel region CH, and the source layer SL.

Figure 25:
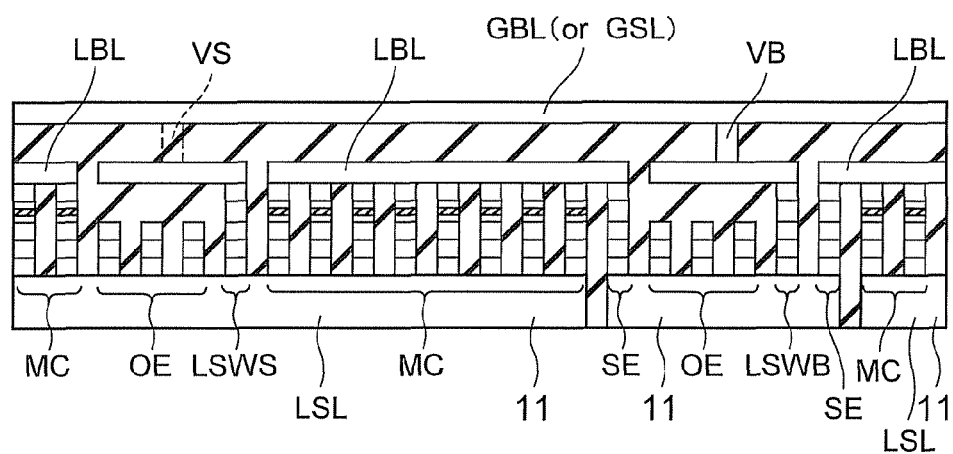
FIG. 25 is a schematic cross-sectional view showing an example of the memory cell array MCA shown in FIG. 23.

FIG. 25 is a schematic cross-sectional view showing an example of the memory cell array MCA shown in FIG. 23 and formed by using the pillar structures shown in FIGS. 24A to 24D. In FIG. 25, hatching of elements shown in FIGS. 24A to 24D is not shown for clarity, except for electric insulation films.

The local source lines LSL are formed on the semiconductor substrate 11. The memory cells MC, the local switches LSWS, and the open elements OE are formed on the local source lines LSL. The local switches LSWB, the short-circuit elements SE, and the open elements OE are formed on the semiconductor substrate 11 insulated from the local source lines LSL by an STI or the like.

Each of the global bit lines GBL is connected to one end of each local switch LSWB via a via VB. The other end of the local switch LSWB is connected to one end (the MTJ element) of each memory cell MC via the short-circuit element SE. The open elements OE are formed as dummy patterns so as to suppress defects in the manufacturing process. The open elements OE are not directly relevant to the operations performed by the memory chip 1.

The global source lines GSL are formed on the same layer as that on which the global bit lines GBL are formed. The global source lines GSL are adjacent to the global bit lines GBL, respectively. Therefore, in FIG. 25, the global source line GSL overlaps with the global bit line GBL and does not appear on the diagram. For example, each of the global source lines GSL is connected to one end of each local switch LSWS via a via VS indicated by a dashed line. The other end of the local switch LSWS is connected to one local source line LSL. The open elements OE on the local source lines LSL are also formed as dummy patterns.

When one word line WL is selectively driven and one local switch LSWB and one local switch LSWS are made conductive, the selected memory cell MC connected to the selected word line WL can be connected between the global bit line GBL and the global source line GSL. It is thereby possible to write data to the selected memory cell MC or read data from the selected memory cell MC.

In this way, in the fifth embodiment, each of the memory cells MC, the local switches LSWB and LSWS, the short-circuit elements SE, and the open elements OE included in the memory cell array MCA is configured to have a vertical pillar structure. By using such pillar structures, the memory cell array MCA can be integrated with a high density.

Figure 26:
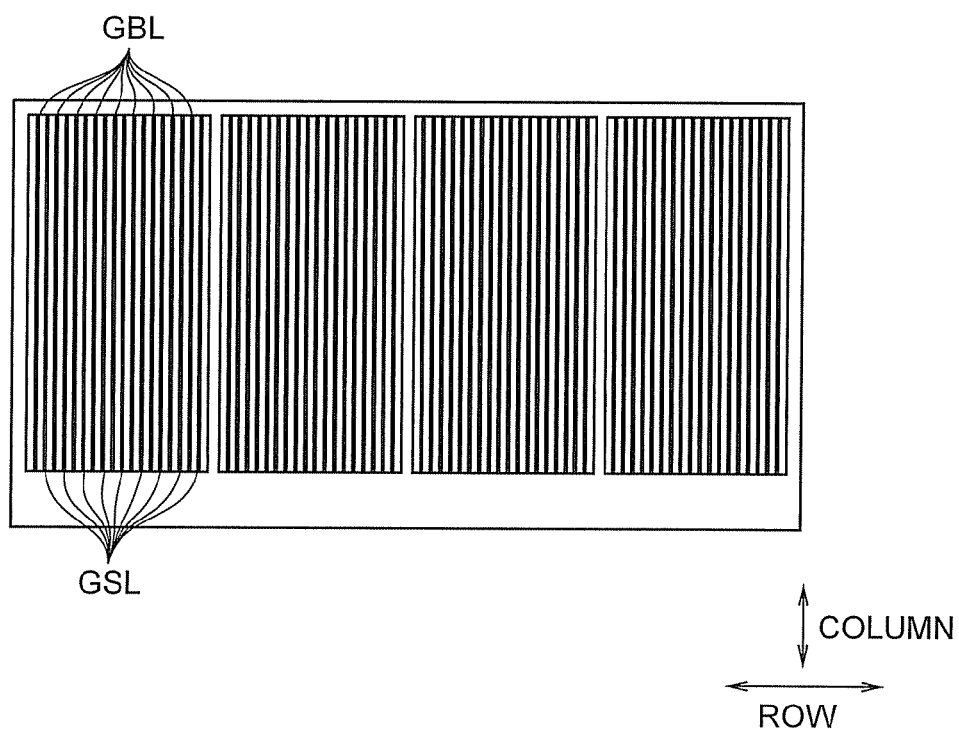
FIG. 26 shows a layout pattern of the global bit lines GBL and the global source lines GSL.

FIG. 26 shows a layout pattern of the global bit lines GBL and the global source lines GSL. The global bit lines GBL and the global source lines GSL are formed by a second metal wiring layer. Both the global bit lines GBL and the global source lines GSL extend in the column direction and are alternately arranged so as to be adjacent to one another.

Figure 27:
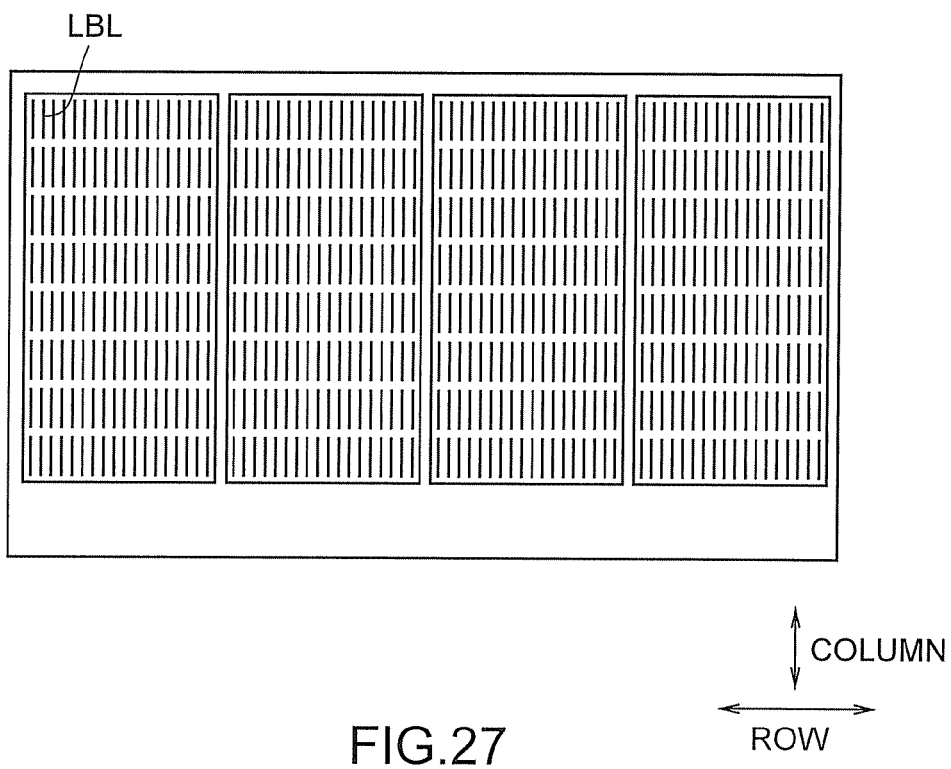
FIG. 27 shows a layout pattern of the local bit lines LBL.

FIG. 27 shows a layout pattern of the local bit lines LBL. The local bit lines LBL are formed by a first metal wiring layer lower than the second metal wiring layer. The local bit lines LBL extend in the column direction and are arranged to be divided into shorter lines than the global bit lines GBL.

Figure 28:
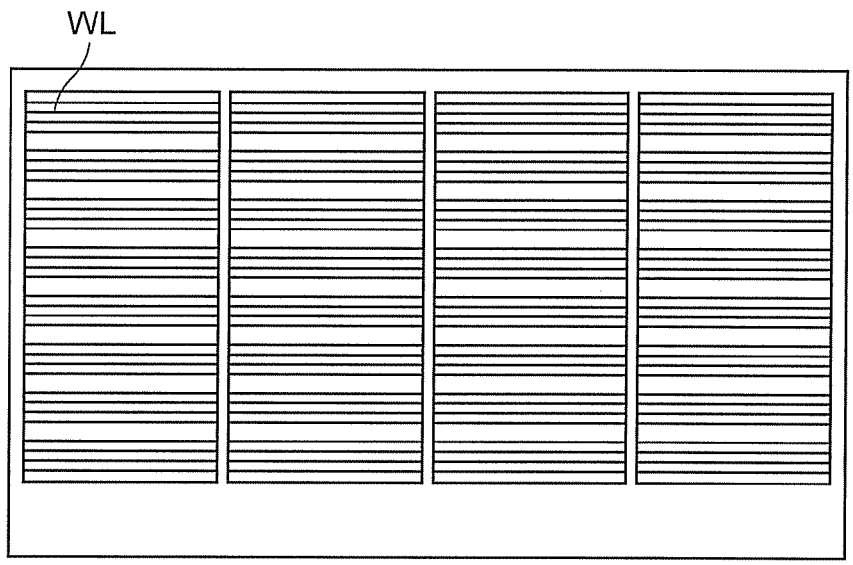
FIG. 28 shows a layout pattern of the word lines WL.

FIG. 28 shows a layout pattern of the word lines WL. The word lines WL are formed by a polysilicon layer lower than the first and second metal wiring layers. The word lines WL extend in the row direction of the memory cell array MCA.

Figure 29:
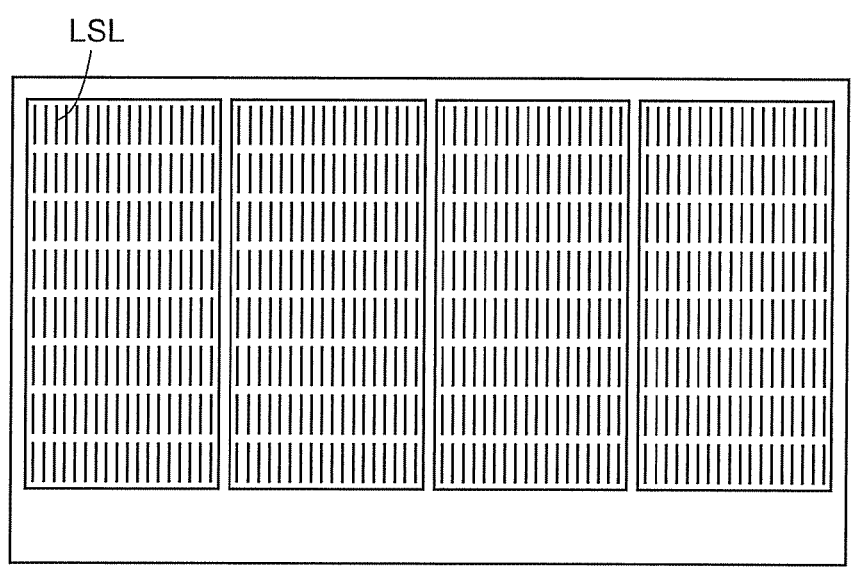
FIG. 29 shows a layout pattern of the local source lines LSL.

FIG. 29 shows a layout pattern of the local source lines LSL. The local source lines LSL are formed in active areas on the semiconductor substrate 11. The local source lines LSL extend in the column direction similarly to the local bit lines LBL, and are divided into shorter lines than the global source lines GSL. The adjacent local source lines LSL are electrically insulated from each other by the STI.

In this way, in the fifth embodiment, the bit lines have a hierarchical structure of the local bit lines LBL and the global bit lines GBL. The source lines similarly have a hierarchical structure of the local source lines LSL and the global source lines GSL. By structuring the bit lines and the source lines hierarchically, it is possible to increase the integration degree of the memory cell array MCA. Furthermore, the memory cells MC, the local switches LSWB and LSWS, the short-circuit elements SE, and the open elements OE constituting the memory cell array MCA are formed into the vertical pillar structures each having a small layout area as already described with reference to FIGS. 13, 14, and 24A to 24D. Therefore, by applying the hierarchical structures of the bit lines and the source lines to the memory cell array MCA, it is possible to considerably improve the integration degree of the memory chip 1. This means that the bit cost of the MRAM can be considerably reduced.

If the bit lines and the source lines are formed into the hierarchical structures, a length of one bit line from one sense amplifier SA to one memory cell MC and a length of one source line from one memory cell MC to one current sink CS increase. In the MRAM, because each sense amplifier SA needs to detect a subtle signal difference, the sense amplifier SA possibly erroneously detects data when the bit lines and the source lines are longer.

Nevertheless, the process irregularities can be eliminated because the memory chip 1 according to the fifth embodiment detects data by the self-referencing method. Therefore, even if the bit lines and the source lines are formed into the hierarchical structures, the sense amplifiers SA can detect data sufficiently accurately. That is, by forming the memory cells MC into the vertical pillar structure, forming the bit lines and the source lines into the hierarchical structures, and adopting the self-referencing method for the read operation as described in the fifth embodiment, the MRAM can improve the integration degree of the memory cell array MCA and accurately detect data.

The fifth embodiment can be combined with the fourth embodiment. The fifth embodiment can also be combined with the second or third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of resistance change storage elements;
a signal holder holding a plurality of voltages according to data stored in the storage elements;
a sense amplifier detecting the data stored in the storage elements based on the voltages held in the signal holder;
a write driver writing data to the storage elements; and
a busy signal controller controlling a busy signal, the busy signal determining whether to permit or reject reception of a read enable signal enabling data to be read from the storage elements or whether to permit or reject reception of a write enable signal enabling data to be written to the storage elements, wherein
in a period during which the busy signal controller controls the busy signal to reject the reception of the read enable signal or the write enable signal,
the signal holder holds a first voltage, a second voltage and a third voltage, the first voltage corresponding to target data stored in a first storage element selected from among the storage elements, the second voltage corresponding to first sample data of first logic written to the first storage element, the third voltage corresponding to second sample data of second logic opposite to the first logic, the second sample data being written to the first storage element,
the sense amplifier detects logic of the target data stored in the first storage element by comparing a read signal based on the first voltage with a reference signal generated based on the second and the third voltages, and
the write driver writes the target data or write data to the first storage element, and
after the write driver writes the write data, the busy signal controller controls the busy signal to permit the reception of the read enable signal or the write enable signal.

2. The device of claim 1, wherein the signal holder comprises:
a first and a second transistors connected in parallel, a gate electrode of each of the first and the second transistors receiving the first voltage; and
a third and a fourth transistors connected in parallel, gate electrodes of the third and the fourth transistors receiving the second voltage and the third voltage, respectively, wherein
the first and the second transistors apply the read signal to the sense amplifier, and
the third and the fourth transistors apply the reference signal to the sense amplifier.

3. The device of claim 2, wherein the signal holder comprises:
a first transfer gate transferring the first voltage to a gate electrode of the first transistor;
a second transfer gate transferring the first voltage to a gate electrode of the second transistor;
a third transfer gate transferring the second voltage to a gate electrode of the third transistor; and
a fourth transfer gate transferring the third voltage to a gate electrode of the fourth transistor.

4. The device of claim 2, wherein the reference signal is a signal obtained from the third and the fourth transistors by an intermediate voltage between the second voltage and the third voltage.

5. The device of claim 1, comprising:
a first storage unit comprising a magnetoresistive random access memory, the magnetoresistive random access memory comprising the storage elements, the signal holder, the sense amplifier, the write driver, and the busy signal controller;
a second storage unit comprising a NAND flash memory; and
a master controller holding an address conversion table showing a relationship between logical addresses of input or output data and physical addresses of the input or output data, the master controller changing one of the physical addresses in the address conversion table between physical addresses of the first storage unit and physical addresses of the second storage unit, based on an access frequency of the one logical address.

6. The device of claim 5, further comprising a third storage unit comprising a hard disk drive, wherein
the address conversion table also shows a relationship between logical addresses of input or output data and physical addresses of the third storage unit, and
the master controller changes the physical address in the address conversion table among the physical addresses of the first to third storage units, based on the access frequency of the one logical address.

7. The device of claim 5, further comprising a common controller commonly provided to the first storage unit and the second storage unit, the common controller selectively controlling the first storage unit or the second storage unit during a data read operation or a data write operation.

8. The device of claim 7, wherein input or output parts of the first and the second storage units, which parts are other than first input parts, are commonly connected to the common controller, the first input parts of the first and the second storage units receiving a chip enable signal activating each of the first and the second storage units.

9. The device of claim 5, wherein, when an access frequency of a logical address is higher than a first threshold, the master controller changes the address conversion table so that the logical address corresponds to one of the physical addresses of the first storage unit, and
when an access frequency of a logical address is equal to or lower than a first threshold, the master controller changes the address conversion table so that the logical address corresponds to one of the physical addresses of the second storage unit.

10. The device of claim 6, wherein, when an access frequency of a logical address is equal to or lower than a first threshold and higher than a second threshold, the master controller changes the address conversion table so that the logical address corresponds to one of the physical addresses of the second storage unit, the second threshold being lower than the first threshold, and when an access frequency of a logical address is equal to or lower than the second threshold, the master controller changes the address conversion table so that the logical address corresponds to one of the physical addresses of the third storage unit.

11. The device of claim 5, wherein the master controller compares an access frequency of a first logical address corresponding to the first storage unit with an access frequency of a second logical address corresponding to the second storage unit, and
when the access frequency of the first logical address is lower than the access frequency of the second logical address, the master controller replaces the physical address corresponding to the first logical address with the physical address corresponding to the second logical address in the address conversion table.

12. The device of claim 7, wherein at least either the common controller or the master controller comprises a working memory formed by using a magnetoresistive random access memory.

13. The device of claim 5, wherein
the magnetoresistive random access memory in the first storage unit comprises a plurality of memory cells,
each of the memory cells comprises:
  a vertical transistor on a surface of a semiconductor substrate, a channel length direction of the vertical transistor being a perpendicular direction to the surface of the semiconductor substrate; and
  a magnetic tunnel junction element stacked on the vertical transistor in the perpendicular direction, the magnetic tunnel junction element being provided so as to overlap the vertical transistor when being viewed from above the surface of the semiconductor substrate.

14. A semiconductor storage device comprising:
a first storage unit including a magnetoresistive random access memory comprising,
  a plurality of resistance change storage elements,
  a signal holder holding a plurality of voltages according to data stored in the storage elements,
  a sense amplifier detecting the data stored in the storage elements based on the voltages held in the signal holder;
a second storage unit comprising a NAND flash memory; and
a master controller holding an address conversion table showing a relationship between logical addresses of input or output data and physical addresses of the input or output data, the master controller changing one of the physical addresses in the address conversion table between physical addresses of the first storage unit and physical addresses of the second storage unit, based on an access frequency of the one logical address, wherein
the signal holder holds a first voltage, a second voltage and a third voltage, the first voltage corresponding to target data stored in a first storage element selected from among the storage elements, the second voltage corresponding to first sample data of first logic written to the first storage element, the third voltage corresponding to second sample data of second logic opposite to the first logic, the second sample data being written to the first storage element, and
the sense amplifier detects logic of the target data stored in the first storage element by comparing a read signal based on the first voltage with a reference signal generated based on the second and the third voltages.

15. The device of claim 14, wherein the signal holder comprises:
  a first transfer gate transferring the first voltage to a gate electrode of the first transistor;
  a second transfer gate transferring the first voltage to a gate electrode of the second transistor;
  a third transfer gate transferring the second voltage to a gate electrode of the third transistor; and
  a fourth transfer gate transferring the third voltage to a gate electrode of the fourth transistor.

16. The device of claim 14, wherein the reference signal is a signal obtained from the third and the fourth transistors by an intermediate voltage between the second voltage and the third voltage.

17. The device of claim 14, further comprising a third storage unit comprising a hard disk drive, wherein
address conversion table also shows a relationship between logical addresses of input or output data and physical addresses of the third storage unit, and
the master controller changes the physical address in the address conversion table among the physical addresses of the first to third storage units, based on the access frequency of the one logical address.

18. The device of claim 14, wherein, when an access frequency of a logical address is higher than a first threshold, the master controller changes the address conversion table so that the logical address corresponds to one of the physical addresses of the first storage unit, and
when an access frequency of a logical address is equal to or lower than a first threshold, the master controller changes the address conversion table so that the logical address corresponds to one of the physical addresses of the second storage unit.

19. The device of claim 14, wherein the master controller compares an access frequency of a first logical address corresponding to the first storage unit with an access frequency of a second logical address corresponding to the second storage unit, and
when the access frequency of the first logical address is lower than the access frequency of the second logical address, the master controller replaces the physical address corresponding to the first logical address with the physical address corresponding to the second logical address in the address conversion table.

20. The device of claim 14, wherein
the magnetoresistive random access memory in the first storage unit comprises a plurality of memory cells,
each of the memory cells comprises:
  a vertical transistor on a surface of a semiconductor substrate, a channel length direction of the vertical transistor being a perpendicular direction to the surface of the semiconductor substrate; and
  a magnetic tunnel junction element stacked on the vertical transistor in the perpendicular direction, the magnetic tunnel junction element being provided so as to overlap the vertical transistor when being viewed from above the surface of the semiconductor substrate.

* * * * *